(12) United States Patent
Nakamura et al.

(10) Patent No.: US 11,070,226 B2
(45) Date of Patent: Jul. 20, 2021

(54) A/D CONVERSION DEVICE

(71) Applicant: DENSO CORPORATION, Kariya (JP)

(72) Inventors: Kunihiko Nakamura, Kariya (JP);
Tomohiro Nezuka, Kariya (JP);
Kazutaka Honda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/937,804

(22) Filed: Jul. 24, 2020

(65) Prior Publication Data

US 2021/0075438 A1    Mar. 11, 2021

(30) Foreign Application Priority Data

Sep. 9, 2019 (JP) .............................. JP2019-163685

(51) Int. Cl.
*H03M 3/00* (2006.01)
*H03M 1/14* (2006.01)

(52) U.S. Cl.
CPC ........... *H03M 3/392* (2013.01); *H03M 1/144* (2013.01); *H03M 3/42* (2013.01); *H03M 3/496* (2013.01)

(58) Field of Classification Search
CPC ........ H03M 3/392; H03M 1/144; H03M 3/42; H03M 3/496
USPC .......................... 341/143, 155, 163, 122, 164
See application file for complete search history.

(56) References Cited

U.S. PATENT DOCUMENTS

| 6,498,819 | B1* | 12/2002 | Martin | H04B 1/005 |
| | | | | 341/143 |
| 2005/0190092 | A1* | 9/2005 | Gulati | H03M 1/005 |
| | | | | 341/155 |
| 2015/0200682 | A1* | 7/2015 | Nezuka | H03M 3/398 |
| | | | | 341/143 |
| 2017/0261562 | A1 | 9/2017 | Honda et al. | |

* cited by examiner

*Primary Examiner* — Peguy Jean Pierre
(74) *Attorney, Agent, or Firm* — Posz Law Group, PLC

(57) ABSTRACT

An A/D conversion device, which operates in one mode including at least one of a ΔΣ mode, a cyclic mode, and a hybrid mode, includes: a first block that processes an analog input signal by a first amplifier; a second block including a second amplifier; a quantization unit that quantizes one of outputs of the first and second blocks; and a control circuit that switches the mode to perform a control corresponding to the mode.

23 Claims, 28 Drawing Sheets

FIG. 11 HYBRID MODE (CYCLIC 2)

HYBRID MODE (CYCLIC 3)

A/D CONVERSION DEVICE

CROSS REFERENCE TO RELATED APPLICATION

The present application claims the benefit of priority from Japanese Patent Application No. 2019-163685 filed on Sep. 9, 2019. The entire disclosure of the above application is incorporated herein by reference.

TECHNICAL FIELD

The present disclosure relates to an analog-to-digital (A/D) conversion device.

BACKGROUND

The applicant has proposed a technique of performing A/D conversion processing using a hybrid mode in which a $\Delta\Sigma$ method and a cyclic method are combined. According to the A/D conversion device, the A/D conversion processing is performed by the $\Delta\Sigma$ method in the hybrid mode to generate a high-order bit, and then the residual is A/D converted by the cyclic method to generate a low-order bit. In the hybrid mode, the A/D conversion device executes A/D conversion processing using an operational amplifier (equivalent to an amplifier) configured in each of the first and second blocks for both the $\Delta\Sigma$ method and the cyclic method.

SUMMARY

An A/D conversion device according to an example embodiment, which operates in one mode including at least one of a $\Delta\Sigma$ mode, a cyclic mode, and a hybrid mode, includes: a first block that processes an analog input signal by a first amplifier; a second block including a second amplifier; a quantization unit that quantizes one of outputs of the first and second blocks; and a control circuit that switches the mode to perform a control corresponding to the mode.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
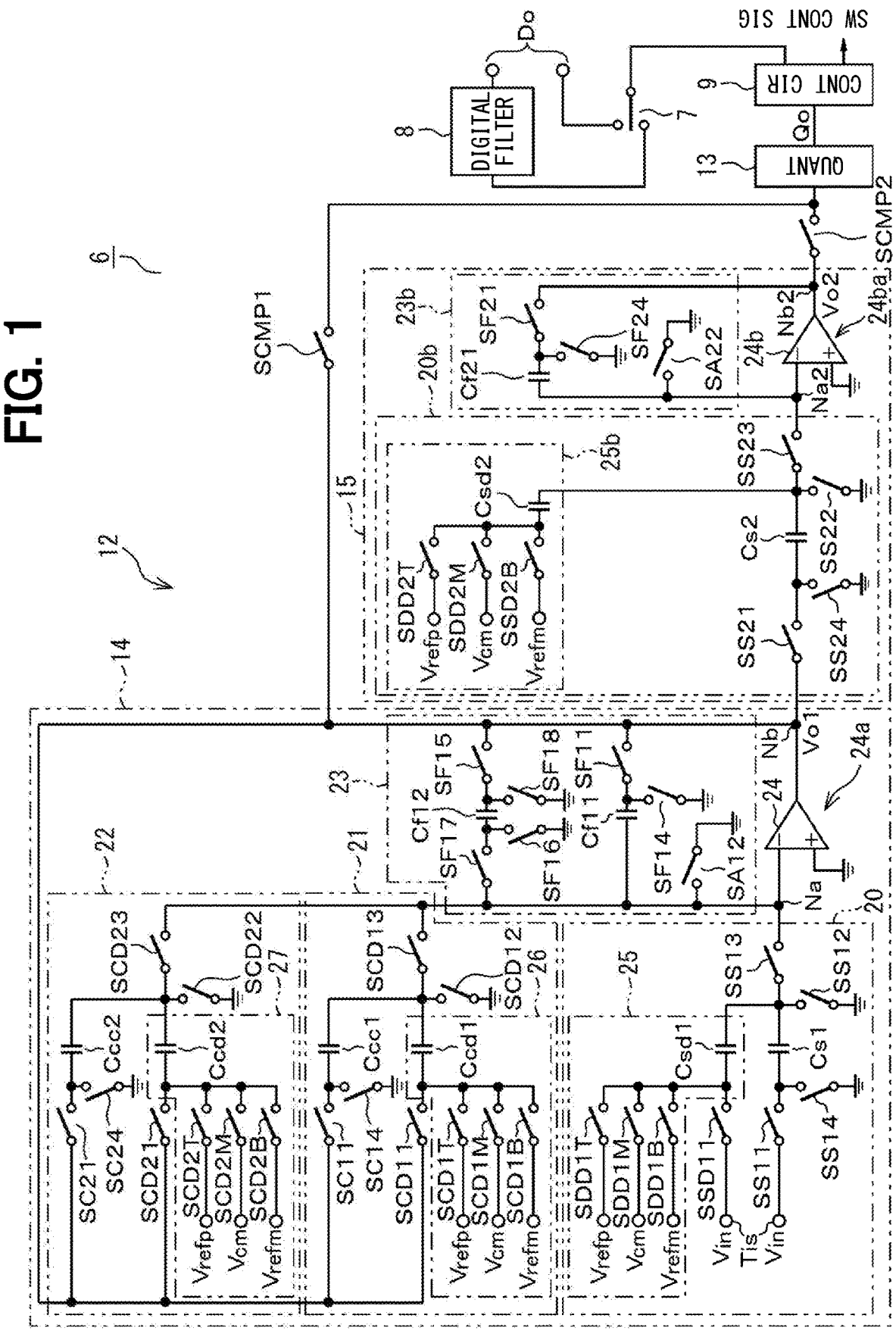
FIG. 1 is an electrical configuration diagram of an A/D conversion device in a first embodiment.

In a hybrid mode, a gain error degrades the linearity, and hence a high-gain amplifier is required to minimize the gain error. When a conceivable A/D conversion device is applied, high-gain operational amplifiers of the same size need be prepared for the first block and the second block. Furthermore, when the high-gain operational amplifiers are used for the first block and the second block, the current consumption of each amplifier increases, which is undesirable.

Thus, an A/D conversion device is provided to be capable of reducing power consumption while reducing a configuration area.

The present embodiment is directed to an A/D conversion device (6; 306; 406; 506; 606) that operates in at least two or more modes, the two modes being a $\Delta\Sigma$ mode in which an analog input signal (Vin) is subjected to A/D conversion processing by a $\Delta\Sigma$ method, and a hybrid mode in which the analog input signal (Vin) is subjected to the A/D conversion processing by the $\Delta\Sigma$ method, and then a residual is subjected to the A/D conversion processing by a cyclic method.

According to the present embodiment, a first block (14) is configured to receive an input of the analog input signal (Vin) and be able to process the signal by using a first amplifier (24), and a second block (15) includes a second amplifier (24b) and receives an input of an output voltage of the first block. A quantization unit (13; 213) is configured to receive an input of one of outputs of the first block and the second block and be able to quantize the output. A control circuit (9) executes control of switching the above-described mode.

In the ΔΣ mode, the control circuit controls a switch so that, by using the first amplifier of the first block and the second amplifier of the second block, the quantization unit quantizes the output and the output of the second block is subjected to the A/D conversion processing by the ΔΣ method. On the other hand, in the hybrid mode, the control circuit controls the switch so that, by using the first amplifier of the first block without using the second amplifier of the second block, the output of the first amplifier of the first block is subjected to the A/D conversion processing while the quantization unit quantizes the output in the ΔΣ method, and then by using the first amplifier, the residual is subjected to the A/D conversion processing by the cyclic method.

The present embodiment is directed to an A/D conversion device (6; 306; 406; 506; 606) that operates in at least two or more modes, the two modes being a ΔΣ mode in which an analog input signal (Vin) is subjected to A/D conversion processing by a ΔΣ method, and a cyclic mode in which the analog input signal (Vin) is subjected to the A/D conversion processing by a cyclic method.

According to the present embodiment, in the ΔΣ mode, the control circuit controls a switch so that, by using the first amplifier of the first block and the second amplifier of the second block, the output of the second block is subjected to the A/D conversion processing by the ΔΣ method while the quantization unit quantizes the output. In the cyclic mode, the control circuit controls the switch so that, by using the first amplifier of the first block without using the second amplifier of the second block, the output of the first amplifier of the first block is subjected to the A/D conversion processing by the cyclic method while the quantization unit quantizes the output.

The present embodiment is directed to an A/D conversion device (6; 306; 406; 506; 606) that operates in any one mode of a ΔΣ mode in which an analog input signal (Vin) is subjected to A/D conversion processing by a ΔΣ method, a cyclic mode in which the analog input signal (Vin) is subjected to the A/D conversion processing by a cyclic method, and a hybrid mode in which the analog input signal (Vin) is subjected to the A/D conversion processing by the ΔΣ method, and then a residual is subjected to the A/D conversion processing by the cyclic method.

According to the present embodiment, in the ΔΣ mode, the control circuit controls a switch so that, by using the first amplifier of the first block and the second amplifier of the second block, the output of the second block is subjected to the A/D conversion processing by the ΔΣ method while the quantization unit quantizes the output. In the hybrid mode, the control circuit controls the switch so that, by using the first amplifier of the first block without using the second amplifier of the second block, the output of the first amplifier of the first block is subjected to the A/D conversion processing while the quantization unit quantizes the output in the ΔΣ method, and then by using the first amplifier, the residual is subjected to the A/D conversion processing by the cyclic method. In the cyclic mode, the control circuit controls the switch so that, by using the first amplifier of the first block without using the second amplifier of the second block, the output of the first amplifier of the first block is subjected to the A/D conversion processing by the cyclic method while the quantization unit quantizes the output.

According to the present embodiment, in the ΔΣ mode, by using the first amplifier of the first block and the second amplifier of the second block, secondary modulation characteristics are provided and the effect of noise shaping can be increased, so that the A/D conversion accuracy can be maintained with high accuracy. On the other hand, in modes except for the ΔΣ mode (hybrid mode and cyclic mode), the operation can be performed with only the first amplifier of the first block, thus eliminating the need to employ a high-gain amplifier for the second amplifier of the second block. Thereby, the configuration area for the second amplifier can be reduced. Further, current consumption can be reduced. In general, the ΔΣ mode is characterized by high accuracy, and the hybrid mode and the cyclic mode are characterized by high speed, so that the mode can be selectively used in accordance with the need of the user.

According to the present embodiment, a block (414) receives an input of the analog input signal (Vin) and is able to process the signal by using an amplifier, and a quantization unit (13) quantizes the output. A control circuit (9) switches the mode and controls a switch to perform control corresponding to the mode. A first sampling capacitor (Cs1) is connected to be able to sample the analog input signal, and a first capacitor (Csd1) is connected to be able to sample the analog input signal.

A second sampling capacitor (Cs2) is connected to be able to sample an output voltage of the block. A first capacitor switching circuit (20) enables charging/discharging of a first capacitor (Csd1) constituting a first digital-to-analog (D/A) converter (25), and a second capacitor switching circuit (420b) enables charging/discharging of a second capacitor (Csd2) constituting a second D/A converter (25b).

In the ΔΣ mode, the control circuit performs a first ΔΣ operation by performing switch control so as to cause the first capacitor to sample the analog input signal by using the amplifier of the block. The control circuit performs a second ΔΣ operation by performing the switch control so as to charge or discharge the first capacitor of the first D/A converter in accordance with a digital output of the quantization unit, and input an output voltage integrated using the amplifier while causing the second sampling capacitor to sample the output voltage. The control circuit performs a third ΔΣ operation by performing the switch control so as to charge or discharge the second capacitor of the second D/A converter and the second sampling capacitor in accordance with a digital output of the quantization unit, and input an output voltage integrated using the amplifier to the quantization uni.

Thereafter, the control circuit repeats the second ΔΣ operation and the third ΔΣ operation to subject an output voltage, integrated using the amplifier of the block by the ΔΣ method, to the A/D conversion processing while causing the quantization unit to quantize the output voltage.

According to the present embodiment, in the hybrid mode, the control circuit performs a fourth ΔΣ operation by performing the switch control so as to sample the analog input signal in the first sampling capacitor by using the amplifier of the block. The control circuit performs a fifth ΔΣ operation by performing the switch control so as to charge or discharge the first capacitor of the first D/A converter and the first sampling capacitor in accordance with a digital output of the quantization unit, and input an output voltage integrated using the amplifier to the quantization uni. Thereafter, the control circuit repeats the fourth ΔΣ operation and the fifth ΔΣ operation to subject an output voltage of the amplifier of the block to the A/D conversion processing by the ΔΣ method while causing the quantization unit to quantize the output voltage, and subject the residual to the A/D conversion processing by the cyclic method.

According to the present embodiment, in the cyclic mode, the control circuit subjects an output voltage, integrated using the amplifier of the block, to the A/D conversion processing by the cyclic method while causing the quantization unit to quantize the output voltage.

According to the present embodiment, in all the modes including the ΔΣ mode, the operation can be performed using the amplifier of a single block, thus eliminating the need to provide the second block that has been required conventionally. As a result, the configuration area for the second block can be reduced. Further, current consumption can be reduced.

Hereinafter, some embodiments of the A/D conversion device will be described with reference to the drawings. In each of the embodiments described below, the same or similar reference numerals are used to designate the same or similar configurations, and a description thereof will be omitted as necessary.

First Embodiment

An A/D conversion device 6 shown in FIG. 1 performs A/D conversion processing on the analog input signal Vin, and is configured to be operable in a ΔΣ mode in which an analog input signal Vin is subjected to the A/D conversion processing by a ΔΣ method, a cyclic mode in which the analog input signal Vin is subjected to the A/D conversion processing by a cyclic method, and a hybrid mode in which the analog input signal Vin is subjected to the A/D conversion processing by the ΔΣ method to generate a high-order bit, and then the residual is subjected to the A/D conversion processing by the cyclic method. A control circuit 9 switches the mode and controls a switch to perform control corresponding to each mode. The detailed operation of these modes will be described later.

A switch 7 is configured to be switchable in accordance with a control signal of the control circuit 9. When the A/D conversion device 6 is to be operated in the ΔΣ mode, the control circuit 9 switches the switch 7 to connect the A/D conversion device 6 and the digital filter 8, whereby the output of the digital filter 8 is taken as output data Do.

When the control circuit 9 operates the A/D conversion device 6 in the cyclic mode or the hybrid mode, the switch 7 is switched to make a connection from the output of the A/D conversion device 6 without interposing the digital filter 8, whereby the output as it is taken as the output data Do. Hereinafter, the configuration of the A/D conversion device 6 and the operations in the ΔΣ mode, the cyclic mode, and the hybrid mode will be described. The A/D conversion device 6 performs processing using a digital integrator in the hybrid mode. The digital integrator is used at the time of combining a high-order bit generated by the A/D conversion processing in the ΔΣ method and a low-order bit generated by the A/D conversion processing in the cyclic method. Although the digital integrator is also classified as a digital filter, since the digital integrator is a function required for the combining processing of the high-order bit and the low-order bit, the digital integrator will be described separately from the digital filter 8 that can be changed to any filter characteristic.

<Configuration of A/D Conversion Device 6>

As shown in FIG. 1, the A/D conversion device 6 includes a signal processing unit 12 and a quantization unit 13. The signal processing unit 12 includes a first block 14 and a second block 15. The analog input signal Vin is input to an input terminal Tis of the first block 14.

The first block 14 includes capacitor switching circuits 20, 21, 22, 23, and an operational amplifier 24 as a first amplifier. The non-inverting input terminal of the operational amplifier 24 is connected to an analog ground line to which a ground potential is applied. The inverting input terminal of the operational amplifier 24 is connected to a common output node Na of the capacitor switching circuits 20, 21, 22. An output voltage Vo1 of the operational amplifier 24 is input to an input node Nb of the second block 15.

The capacitor switching circuit 20 includes a capacitor Cs1, switches SS11 to SS14, SSD11, and a digital-to-analog (D/A) converter 25. The capacitor Cs1 is used as a sampling capacitor for sampling the analog input signal Vin input from the input terminal Tis. The capacitor Cs1 is charged or discharged in response to switches SS11 to SS14 each being turned on or off by the control circuit 9. One terminal of the capacitor Cs1 is connected to the input terminal Tis via the switch SS11, and is connected to the analog ground line via the switch SS14. The other terminal of the capacitor Cs1 is connected to the node Na via the switch SS13, and is connected to the analog ground line via the switch SS12.

The D/A converter 25 includes a plurality of switches SDD1T, SDD1M, SDD1B, and a capacitor Csd1. The capacitor Csd1 is used as a D/A converter (DAC) capacitor of the D/A converter 25. The switch SSD11 is connected between the input terminal Tis and the other terminal of the capacitor Csd1. The switch SSD11 is a switch that is controlled when the capacitor Csd1 is used as a sampling capacitor, and can be turned on/off by the control circuit 9. The capacitor Csd1 may also serve as a sampling capacitor configured to sample the analog input signal Vin that is input from the input terminal Tis through the switch SSD11.

The control circuit 9 selectively turns on the switches SDD1T, SDD1M, SDD1B to apply any one of converted outputs Vrefp, Vcm, Vrefm of the quantization unit 13 to the other terminal of the capacitor Csd1. The converted outputs Vrefp, Vcm, Vrefm of the quantization unit 13 is equivalent to analog voltages obtained by performing D/A conversion processing on the output digital values of the quantization unit 13, and have a relationship of, for example, Vrefp>Vcm>Vrefm, where Vcm is an analog ground voltage. Hereinafter, the selected converted output is abbreviated as VR when necessary.

The capacitor switching circuit 21 includes a capacitor Ccc1, switches SC11, SC14, SCD11 to SCD13, and a D/A converter 26. The capacitor Ccc1 is configured to be charged or discharged in response to switches SC11, SC14, SCD12, SCD13 each being turned on or off by the control circuit 9. One terminal of the capacitor Ccc1 is connected to the node Na via the switch SCD13, and is connected to the analog ground line via the switch SCD12. The other terminal of the capacitor Ccc1 is connected to the node Nb via the switch SC11, and is connected to the analog ground line via the switch SC14.

The D/A converter 26 includes a plurality of switches SCD1T, SCD1M, SCD1B and a capacitor Ccd1. The control circuit 9 selectively turns on the switches SCD1T, SCD1M, SCD1B to apply any one of the converted outputs Vrefp, Vcm, Vrefm of the quantization unit 13 to the other terminal of the capacitor Ccd1. The switch SCD11 is connected between an output node Nb of the first block 14 and the other terminal of the capacitor Ccd1. The switches SC11, SCD11 are switches used at the time of sampling the voltage of the output node Nb to the capacitors Ccc1, Ccd1 by a cyclic method, and are configured to be on/off-controllable by the control circuit 9.

The capacitor switching circuit 22 includes a capacitor Ccc2, switches SC21, SC24, SCD21 to SCD23, and a D/A converter 27. The capacitor Ccc2 is configured to be charged or discharged in response to switches SC21, SC24, SCD22, SCD23 each being turned on or off by the control circuit 9. One terminal of the capacitor Ccc2 is connected to the node Na via the switch SCD23, and is connected to the analog ground line via the switch SCD22. The other terminal of the capacitor Ccc2 is connected to the node Nb via the switch SC21, and is connected to the analog ground line via the switch SC24.

The D/A converter 27 includes a plurality of switches SCD2T, SCD2M, SCD2B, and a capacitor Ccd2. The control circuit 9 selectively turns on the switches SCD2T, SCD2M, SCD2B to apply any one of the converted outputs Vrefp, Vcm, Vrefm of the quantization unit 13 to the other terminal of the capacitor Ccd2. The switch SCD21 is connected between the output node Nb of the first block 14 and the other terminal of the capacitor Ccd2. The switches SC21, SCD21 are switches used at the time of sampling the voltage of the output node Nb to the capacitors Ccc2, Ccd2 by the cyclic method, and are configured to be on/off-controllable by the control circuit 9.

The capacitor switching circuit 23 includes switches SF11, SF14 to SF18, SA12, and capacitors Cf11, Cf12. The capacitors Cf11, Cf12 are configured as feedback capacitors between an input node Na and an output node Nb of the operational amplifier 24. One terminal of the capacitor Cf11 is connected to the node Na, and is connected to the analog ground line via the switch SA12. The other terminal of the capacitor Cf11 is connected to the node Nb via the switch SF11, and is connected to the analog ground line via the switch SF14.

One terminal of the capacitor Cf12 is connected to the node Na via the switch SF17, and is connected to the analog ground line via the switch SF16. The other terminal of the capacitor Cf12 is connected to the node Nb via the switch SF15, and is connected to the analog ground line via the switch SF18.

The second block 15 is cascade-connected after the first block 14. The second block 15 includes capacitor switching circuits 20b, 23b, and an operational amplifier 24b as a second amplifier. The non-inverting input terminal of the operational amplifier 24b is connected to the analog ground line. The inverting input terminal of the operational amplifier 24b is connected to an output node Na2 of the capacitor switching circuit 20b.

The capacitor switching circuit 20b includes a capacitor Cs2, switches SS21 to SS24, and a D/A converter 25b. The capacitor Cs2 is used as a sampling capacitor configured to sample the output voltage Vo1 that is input from the output node Nb of the first block 14 through the switch SS21. The capacitor Cs2 is charged or discharged in response to switches SS21 to SS24 each being turned on or off by the control circuit 9.

One terminal of the capacitor Cs2 is connected to the node Nb via the switch SS21, and is connected to the analog ground line via the switch SS24. The other terminal of the capacitor Cs2 is connected to the node Na2 via the switch SS23, and is connected to the analog ground line via the switch SS22.

The D/A converter 25b includes a plurality of switches SDD2T, SDD2M, SDD2B, and a capacitor Csd2. The control circuit 9 selectively turns on the switches SDD2T, SDD2M, SDD2B to apply any of the converted outputs Vrefp, Vcm, Vrefm of the quantization unit 13 to the other terminal of the capacitor Csd2.

The capacitor switching circuit 23b includes switches SF21, SF24, SA21, and a capacitor Cf21. The capacitor Cf21 is configured as a feedback capacitor between the input node Na2 and the output node Nb2 of the operational amplifier 24b. One terminal of the capacitor Cf21 is connected to the node Na2, and is connected to the analog ground line via the switch SA22. The other terminal of the capacitor Cf21 is connected to the node Nb2 via the switch SF21, and is connected to the analog ground line via the switch SF24.

A switch SCMP1 is connected between the output node Nb of the first block 14 and the input of the quantization unit 13. A switch SCMP2 is connected between the output node Nb2 of the second block 15 and the input node of the quantization unit 13. The control circuit 9 can selectively input the output voltage Vo1 of the first block 14 or an output voltage Vo2 of the second block 15 to the quantization unit 13 by selectively turning on the switches SCMP1, SCMP2. The quantization unit 13 is constituted by an A/D converter, and can quantize either the output voltage Vo1 of the first block 14 or the output voltage Vo2 of the second block 15. The quantization unit 13 generates a quantized value Qo as a three-level (1.5 bit) digital output and outputs the quantized value Qo to the control circuit 9.

<Description of Operation in Each Mode>

In the following, the operations of the first block 14 and the second block 15 in the ΔΣ mode, the cyclic mode and the hybrid mode will be described. In the following description of the operations, the switch to be on-controlled by the control circuit 9 in each mode will be described, and the description of the switch to be off controlled will be omitted as necessary.

(1) ΔΣ Mode

Figure 2:
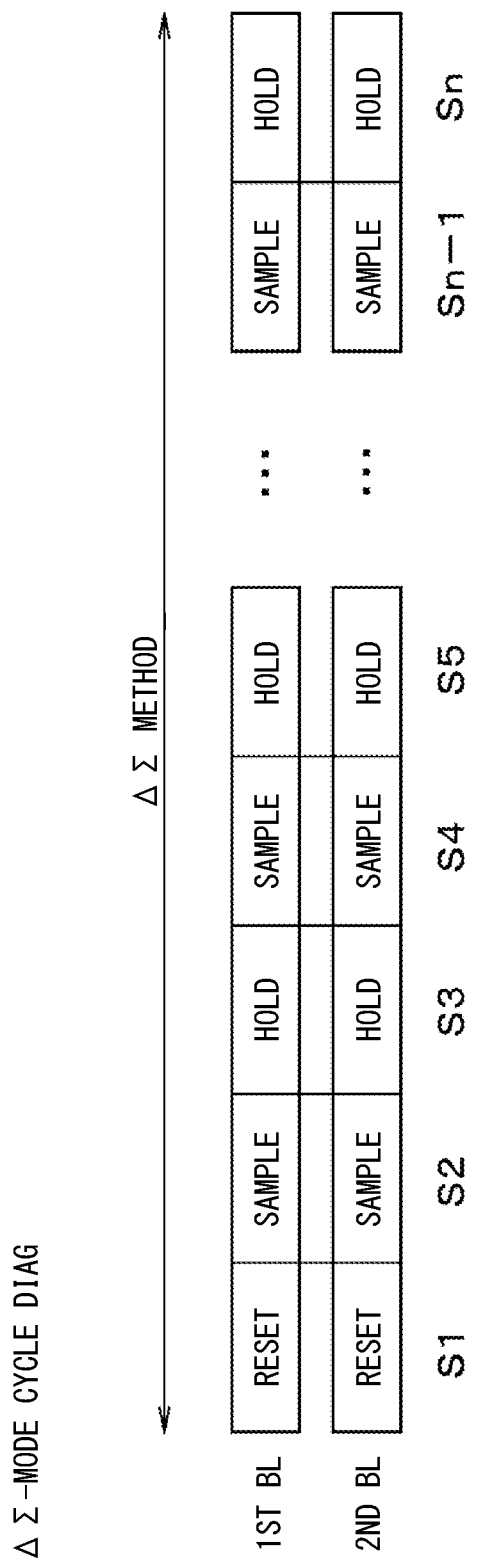
FIG. 2 is an explanatory diagram schematically showing a flow of processing for one cycle in a $\Delta\Sigma$ mode.

In the ΔΣ mode shown in the cycle diagram in FIG. 2, the A/D conversion device 6 executes a so-called oversampling type A/D conversion processing. In FIG. 2, "Reset," "Sample," and "Hold" indicate timings at which a reset operation, a ΔΣ sample operation, and the ΔΣ hold operation are performed, respectively. The first block 14 and the second block 15 perform the reset operation, the ΔΣ sample operation, and the ΔΣ hold operation simultaneously and in parallel. The first block 14 and the second block 15 perform the reset operation in step S1, perform the ΔΣ sample operation in step S2, and then perform the ΔΣ hold operation in step S3.

Then, the ΔΣ sample operation and the ΔΣ hold operation are repeated as shown in steps S4, S5, . . . , Sn−1, Sn. At this time, in the A/D conversion device 6, the quantization unit 13 continues digital output while these operations are oversampled a predetermined number of times to perform the A/D conversion processing, and the digital filter 8 low-pass filters the output of the quantization unit 13 to generate output data Do.

<Reset Operation>

Figure 3:
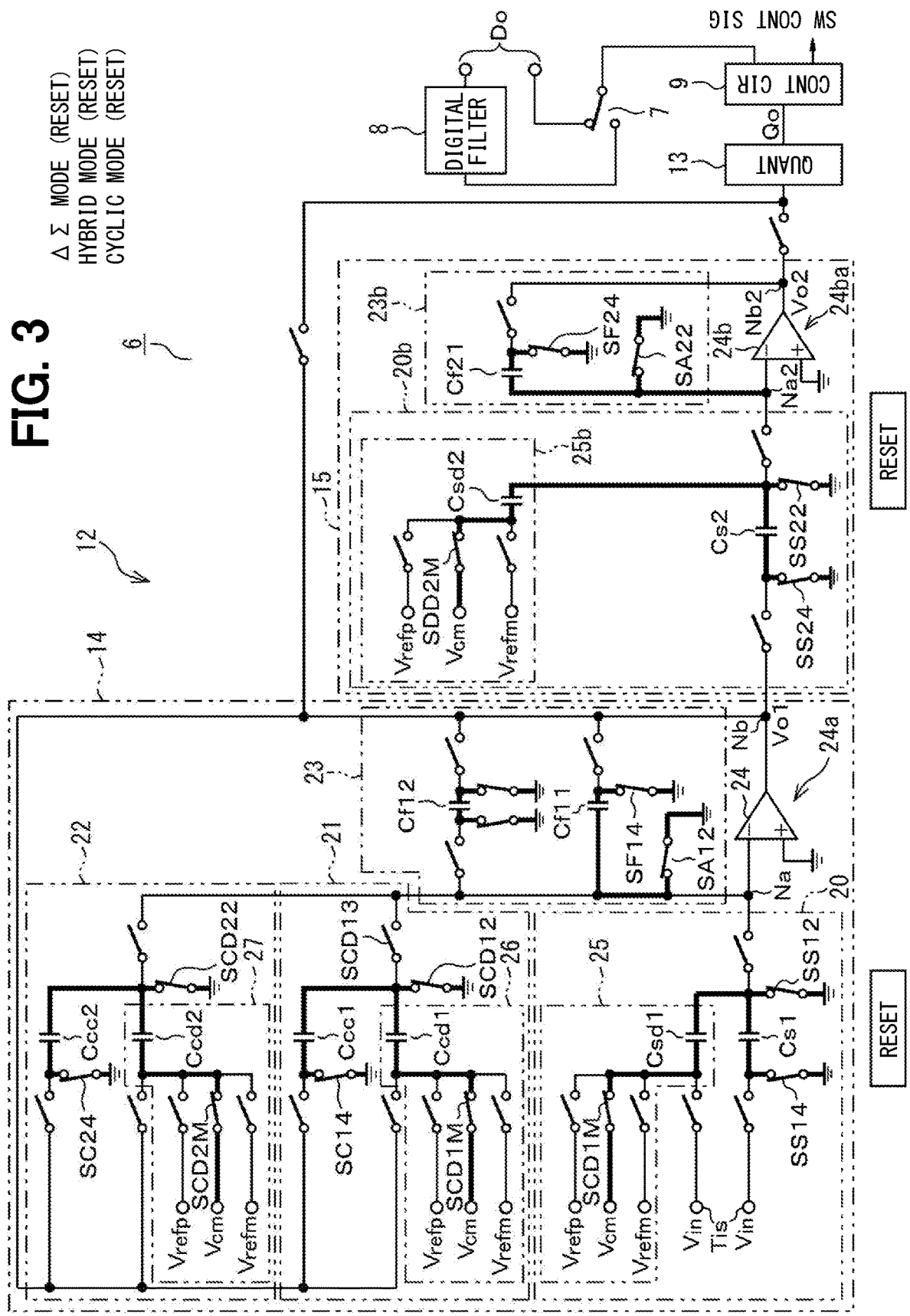
FIG. 3 is an explanatory diagram schematically showing one operation stage in a $\Delta\Sigma$ mode (Part 1)

As shown in FIG. 3, the control circuit 9 turns on the switches SS14, SS12, SDD1M, SC14, SCD12, SCD1M, SC24, SCD22, SCD2M, SA12, SF14, SF16, SF18 to release the charge stored in the capacitors Cs1, Csd1, Ccc1, Ccd1, Ccc2, Ccd2, Cf11, Cf12 to the analog ground line, thereby resetting the first block 14. The control circuit 9 turns on the switches SS22, SS24, SDD2M, SA22, SF24 to release the charge stored in the capacitors Cs2, Csd2, Cf21 to the analog ground line, thereby resetting the second block 15. The control circuit 9 performs resetting processing on the digital filter 8 before setting the ΔΣ mode.

<ΔΣ Sample Operation in ΔΣ Mode>

Figure 4:
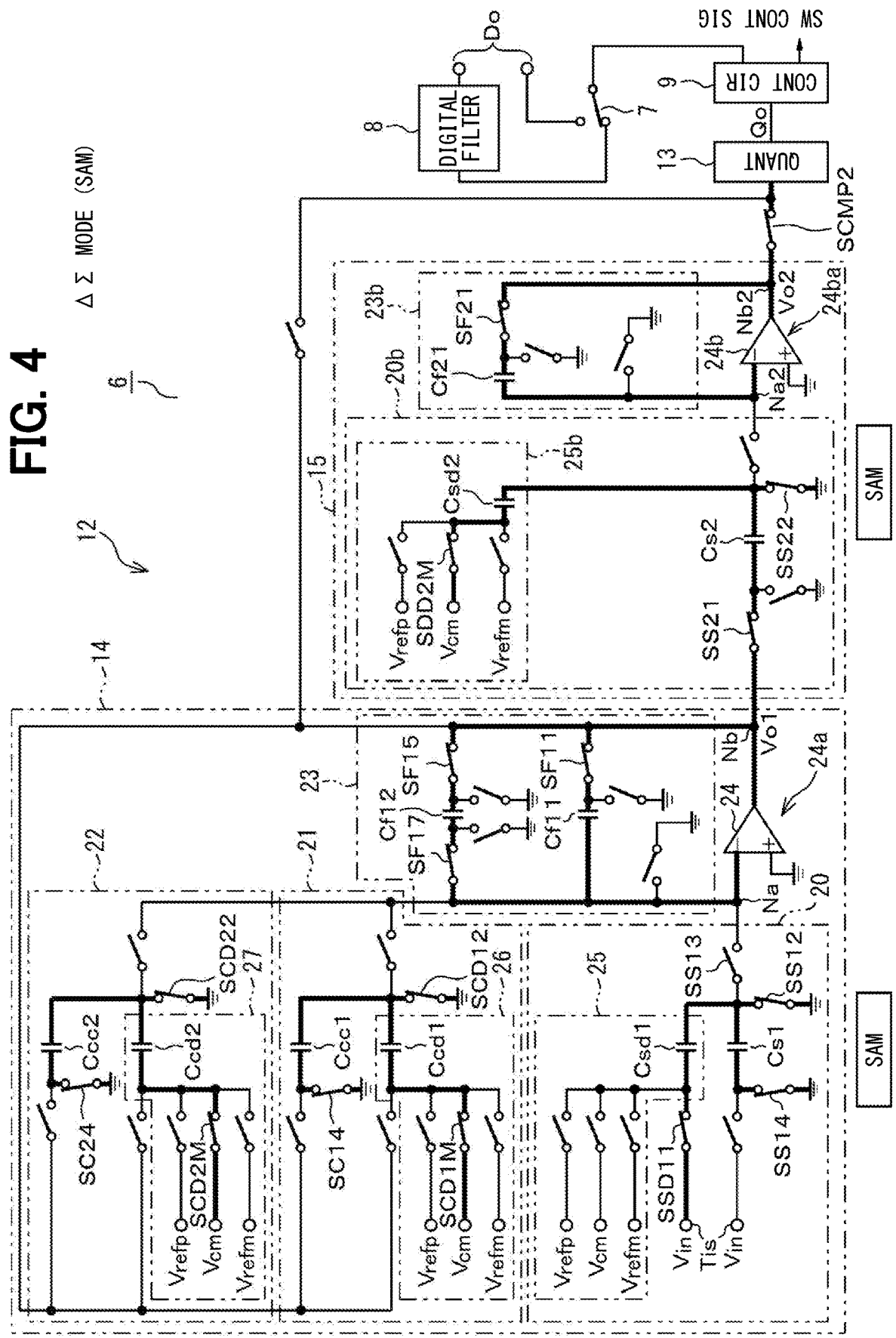
FIG. 4 is an explanatory diagram schematically showing one operation stage in the $\Delta\Sigma$ mode (Part 2)

As shown in FIG. 4, the control circuit 9 turns on the switches SSD11, SS12, SS14, SCD1M, SCD12, SC14, SCD2M, SCD22, SC24, SF11, SF15, SF17 of the first block 14. At this time, the control circuit 9 turns on the switches SSD11, SS12, SS14 of the first block 14 to cause the capacitor Csd1 to sample the analog input signal Vin by The control circuit 9 turns on the switches SF11, SF15, SF17, whereby the capacitors Cf11, Cf12 are connected in parallel between the inverting input terminal and the output terminal of the operational amplifier 24.

The control circuit 9 turns on the switches SS21, SS22, SDD2M, SF21 of the second block 15 to input the output voltage Vo1 of the output node Nb of the first block 14 to the other terminal of the capacitor Cs1. At this time, the capacitor Cs2 samples the output voltage Vo1 of the first block 14.

On the other hand, with the control circuit 9 turning on the switch SF21, the capacitor Cf21 is connected between the input node Na2 and the output node Nb2 of the operational amplifier 24b. Thus, the second block 15 can output a voltage corresponding to the charge stored in the capacitor Cf21 from the node Nb2. Further, the control circuit 9 turns on the switch SCMP2 to connect the output node Nb2 of the second block 15 to the quantization unit 13. Hence the quantization unit 13 quantizes the output voltage Vo2 of the second block 15 and digitally outputs the quantized voltage to the control circuit 9. The control circuit 9 selects the converted output VR to be used in the subsequent ΔΣ hold operation.

<ΔΣ Hold Operation in ΔΣ Mode>

Figure 5:
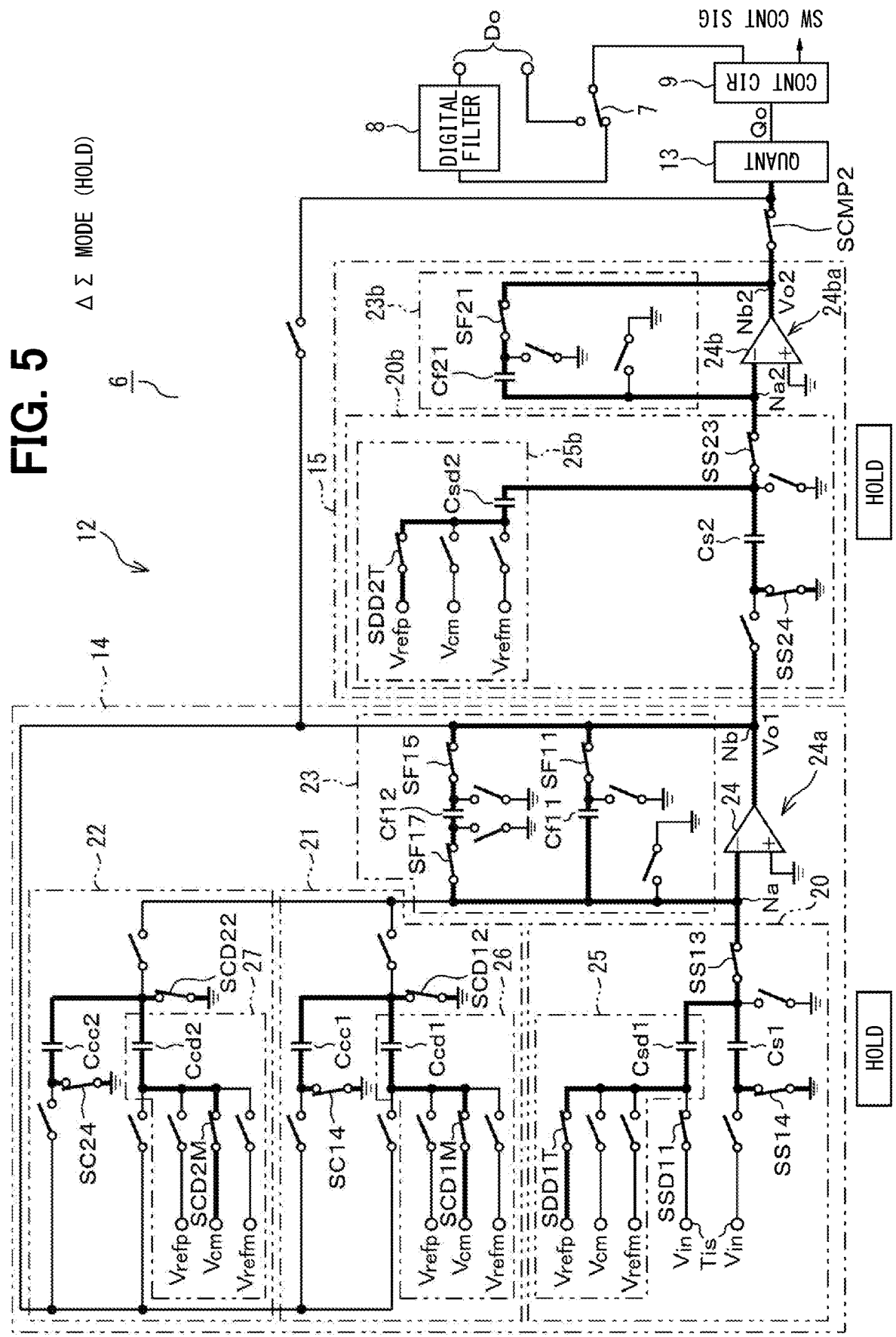
FIG. 5 is an explanatory diagram schematically showing one operation stage in the $\Delta\Sigma$ mode (Part 3)

As shown in FIG. 5, the control circuit 9 turns on the switches SS14, SS13, SCD1M, SCD12, SC14, SCD2M, SCD22, SC24, SF11, SF15, SF17 of the first block 14. At this time, with the control circuit 9 turning on the switch SS13, one ends of the capacitors Cs1, Csd1 can be connected to the inverting input terminal of the operational amplifier 24. Further, with the control circuit 9 turning on the switches SF11, SF15, SF17, the capacitors Cf11, Cf12 can be connected in parallel to the input/output terminal of the operational amplifier 24.

Further, the control circuit 9 turns on the switch (here, assumed to be SDD1T) corresponding to the converted output VR. During <ΔΣ sample operation> described above, charge is stored into the capacitor Csd1, but during <ΔΣ hold operation> described above, residual charge, obtained by subtracting the charge corresponding to the converted output VR of the quantization unit 13 from the stored charge of the capacitor Csd1 and fed back, is transferred to each of the capacitors Cf11, Cf12. Thereby, the residual charge is stored into the capacitors Cf11, Cf12, and an integrator 24a outputs an integrated voltage corresponding to the charge stored in the capacitors Cf11, Cf12 from the node Nb.

On the other hand, the control circuit 9 turns on the switches SS23, SS24, SF21 and the switch (here, assumed to be SDD2T) of the D/A converter 25b corresponding to the converted output VR in the second block 15. During <ΔΣ sample operation> described above, charge is stored in the capacitor Cs2, but during <ΔΣ hold operation>, residual charge, obtained by subtracting the charge corresponding to the converted output VR of the quantization unit 13 from the stored charge of the capacitor Cs2 and fed back, is transferred to the capacitor Cf21. Thereby, the residual charge is stored into the capacitor Cf21, and the operational amplifier 24b outputs from the node Nb2 an integrated voltage corresponding to the stored charge of the capacitor Cf21 obtained by an integrator 24ba.

As shown in FIG. 2, the first block 14 and the second block 15 simultaneously execute <ΔΣ sample operation> and <ΔΣ hold operation> described above alternately and repeatedly a predetermined number of times. In the ΔΣ mode, the first block 14 and the second block 15 are in the same operating state at the same timing. While the control circuit 9 of the A/D conversion device 6 oversamples these operations, the quantization unit 13 continues to output a value, and the digital filter 8 low-pass filters the output value of the quantization unit 13 to generate output data Do.

In this way, in the ΔΣ mode, the A/D conversion processing is performed by the ΔΣ method, using the operational amplifier 24 of the first block 14 and the operational amplifier 24b of the second block 15 while the output of the second block 15 is quantized by the quantization unit 13, so that the A/D conversion has secondary modulation characteristics and the effect of the noise shaping becomes large, thus enabling the A/D conversion with high accuracy.

As shown in FIGS. 3 to 5, in the ΔΣ mode, the control circuit 9 keeps the switches SCD12, SCD1M, SC14, SCD22, SCD2M, SC24 of the first block 14 on. Therefore, the voltages across the capacitors Ccc1, Ccd1, Ccc2, Ccd2 are kept zero.

(2) Hybrid Mode

Figure 6:
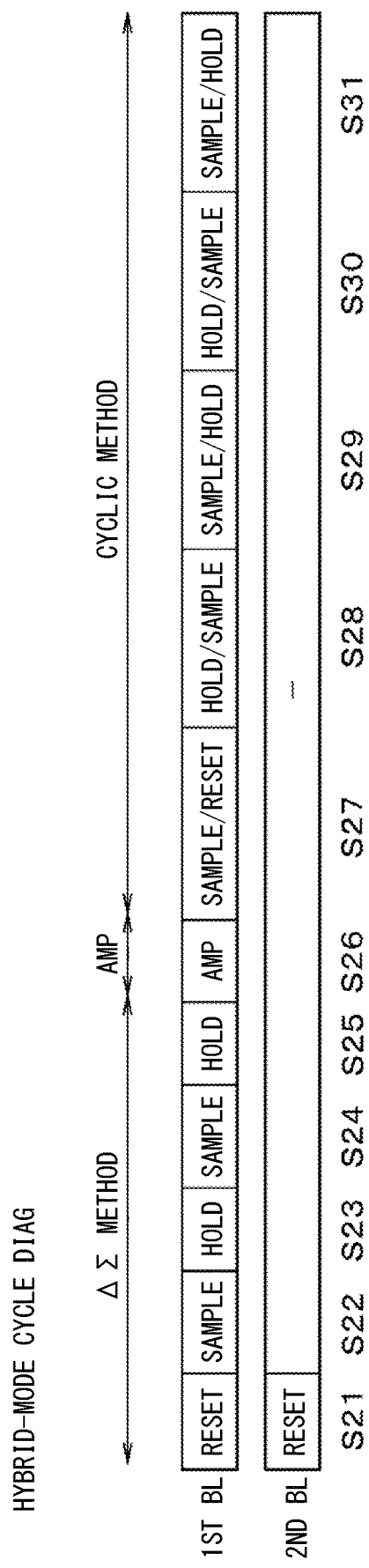
FIG. 6 is an explanatory diagram schematically showing a flow for processing for one cycle in a hybrid mode.

FIG. 6 shows a cycle diagram of the hybrid mode, and "Reset," "Sample," "Hold," and "Amp" in FIG. 6 indicate timings at which the reset operation, the sample operation, the hold operation, and an amplification operation are performed, respectively.

As shown in FIG. 6, in the hybrid mode, the A/D conversion device 6 performs the A/D conversion processing on the analog input signal Vin by the ΔΣ method, using the first block 14 without using the operational amplifier 24b of the second block 15, and then performs the A/D conversion processing on the residual by the cyclic method. In the hybrid mode, the A/D conversion device 6 performs the A/D conversion processing by the ΔΣ method and then performs amplification processing before performing the A/D conversion processing by the cyclic method, but this is not restrictive.

<Reset Operation in Hybrid Mode>

First, in S21, the control circuit 9 simultaneously resets the first block 14 and the second block 15. The processing operation at this time is the same as that of the reset operation in the ΔΣ mode, and hence a description thereof will be omitted. Thereafter, the A/D conversion device 6 alternately repeats the ΔΣ sample operation and the ΔΣ hold operation of the ΔΣ method a predetermined number of times (e.g., a few dozen times) by using only the first block 14. See S22 to S25 in FIG. 6.

<ΔΣ Sample Operation in Hybrid Mode>

Figure 7:
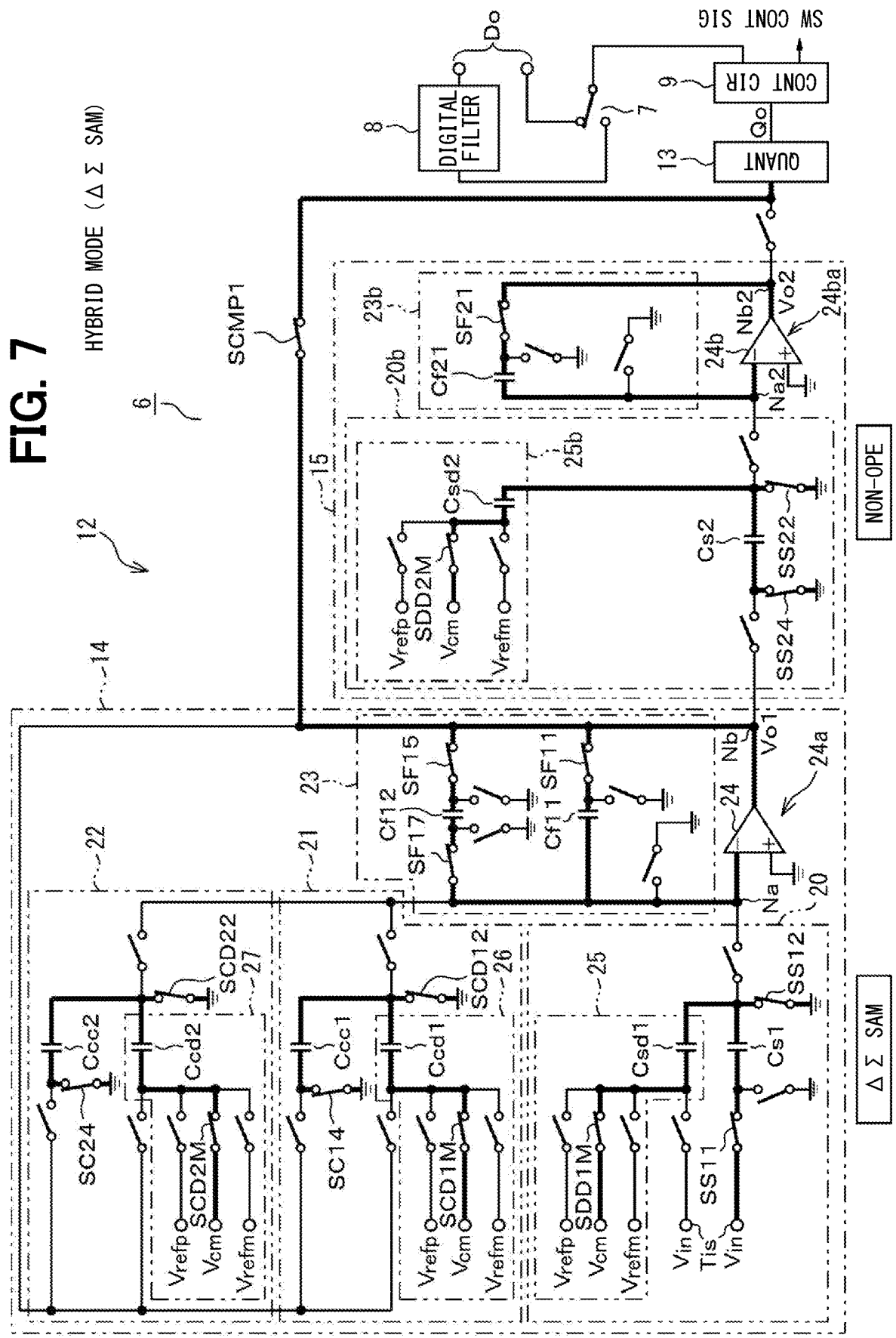
FIG. 7 is an explanatory diagram schematically showing one operation stage in the hybrid mode (Part 1)

As shown in FIG. 7, the control circuit 9 turns on the switches SDD1M, SS11, SS12 of the first block 14, thereby causing the capacitor Cs1 to sample the analog input signal Vin. At the same time, the control circuit 9 turns on the switches SF11, SF15, SF17, so that the capacitors Cf11, Cf12 are connected in parallel between the inverting input terminal and the output terminal of the operational amplifier 24.

The control circuit 9 turns on the switch SCMP1 to connect the output node Nb of the first block 14 to the quantization unit 13. Thus, the quantization unit 13 quantizes the output voltage Vo1 of the first block 14 and digitally outputs the output voltage Vo1 to the control circuit 9, and the control circuit 9 selects the converted output VR to be used in the subsequent ΔΣ hold operation.

On the other hand, the control circuit 9 turns on the switches SS22, SS24, SDD2M, SF21 of the second block 15 to set both end potentials of the capacitors Cs2, Csd2 to the ground level and bring the second amplifier formed by the operational amplifier 24 into a feedback state, whereby the second block 15 can be bright into q non-operating state.

<ΔΣ Hold Operation in Hybrid Mode>

Figure 8:
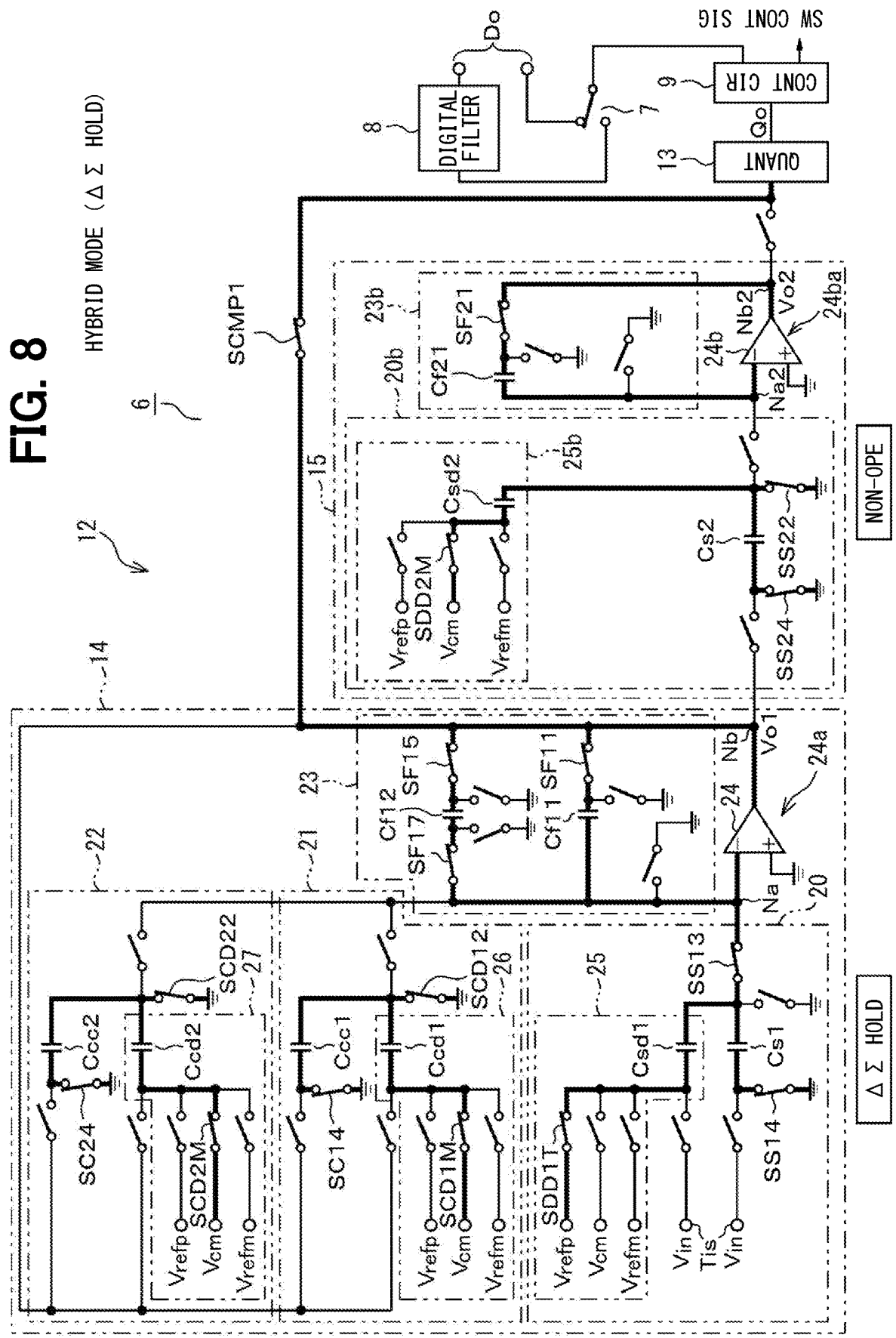
FIG. 8 is an explanatory diagram schematically showing one operation stage in the hybrid mode (Part 2)

As shown in FIG. 8, the control circuit 9 turns on switches SS14, SS13 of the first block 14 and the switch (here, assumed to be SDD1T) of the D/A converter 25 corresponding to the converted output VR to connect one ends of the capacitors Cs1, Csd1 to the inverting input terminal of the operational amplifier 24. During the above-described ΔΣ sample operation, charge is stored into the capacitor Cs1, but during the ΔΣ hold operation, residual charge, obtained by subtracting the charge corresponding to the converted output VR from the stored charge of the capacitor Cs1 and fed back, is transferred to each of the capacitors Cf11, Cf12. Thereby, the residual charge is stored into the capacitors Cf11, Cf12, and the operational amplifier 24 outputs from the node Nb an integrated voltage corresponding to the stored charge of the capacitors Cf11, Cf12 obtained by an integrator 24a.

As thus described, the A/D conversion device 6 executes the A/D conversion processing by the ΔΣ method by repeatedly executing <ΔΣ sample operation in the hybrid mode> and <ΔΣ hold operation in the hybrid mode> a predetermined number of times.

<Amplification Operation in Hybrid Mode>

Figure 9:
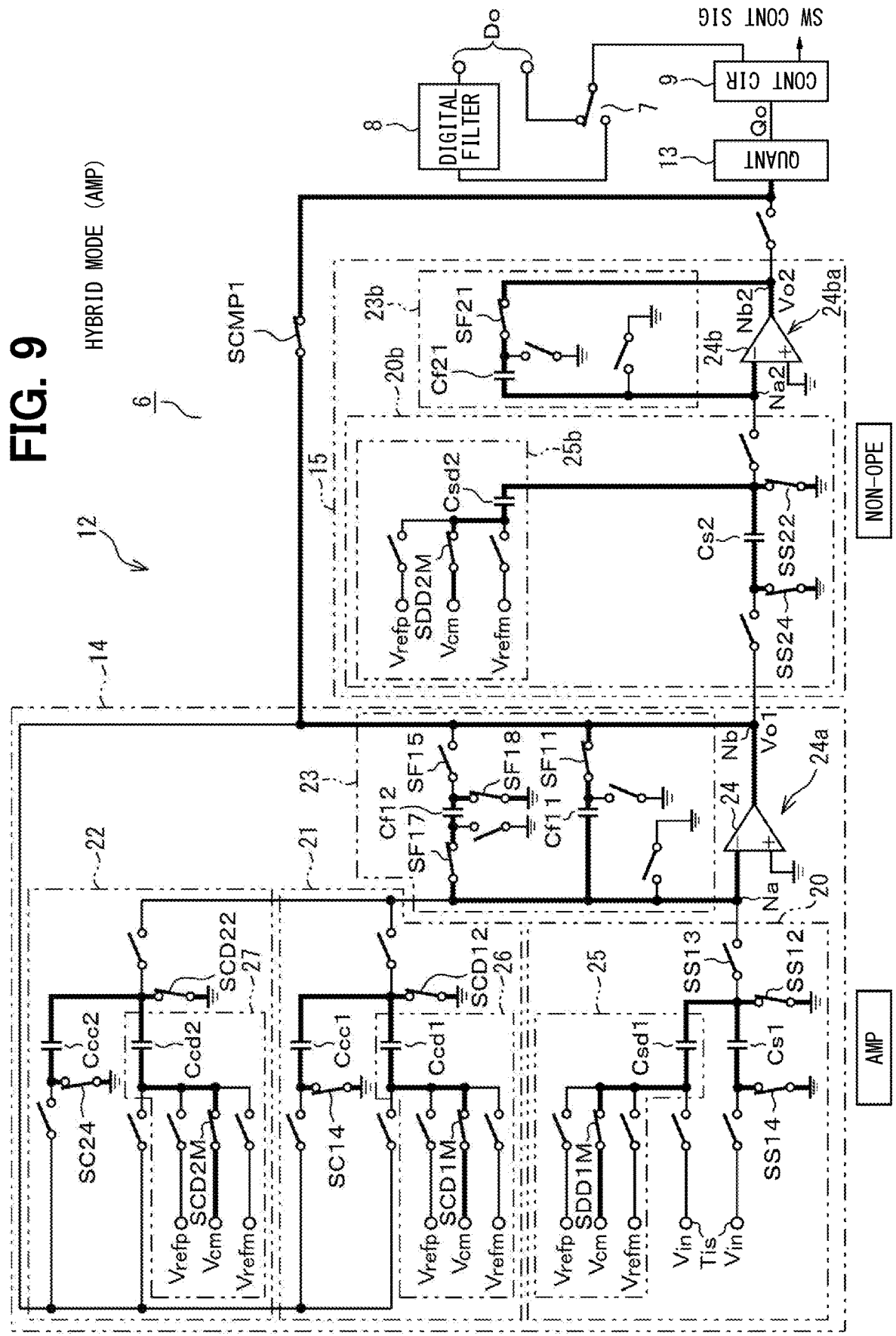
FIG. 9 is an explanatory diagram schematically showing one operation stage in the hybrid mode (Part 3)

The A/D conversion device 6 repeats the ΔΣ sample operation and the ΔΣ hold operation a predetermined number of times, and then amplifies the signal in the first block 14 in S26 of FIG. 6. At this time, as shown in FIG. 9, the control circuit 9 turns off the switch SS13 to disconnect the capacitors Csd1, Cs1 from the node Na, and turns off the switch SF15 and turns on the switch SF18 to disconnect the output node Nb side of the capacitor Cf12. Thus, the operational amplifier 24 and the capacitor Cf11 amplify the signal in accordance with the charge stored in the capacitor Cf12 and output the amplified signal to the node Nb. The control circuit 9 turns on the switches SS12, SS14, SDD1M of the first block 14 to make the charge stored in the capacitors Csd1, Cs1 zero.

<Cyclic Operation Part 1 in Hybrid Mode>

Figure 10:
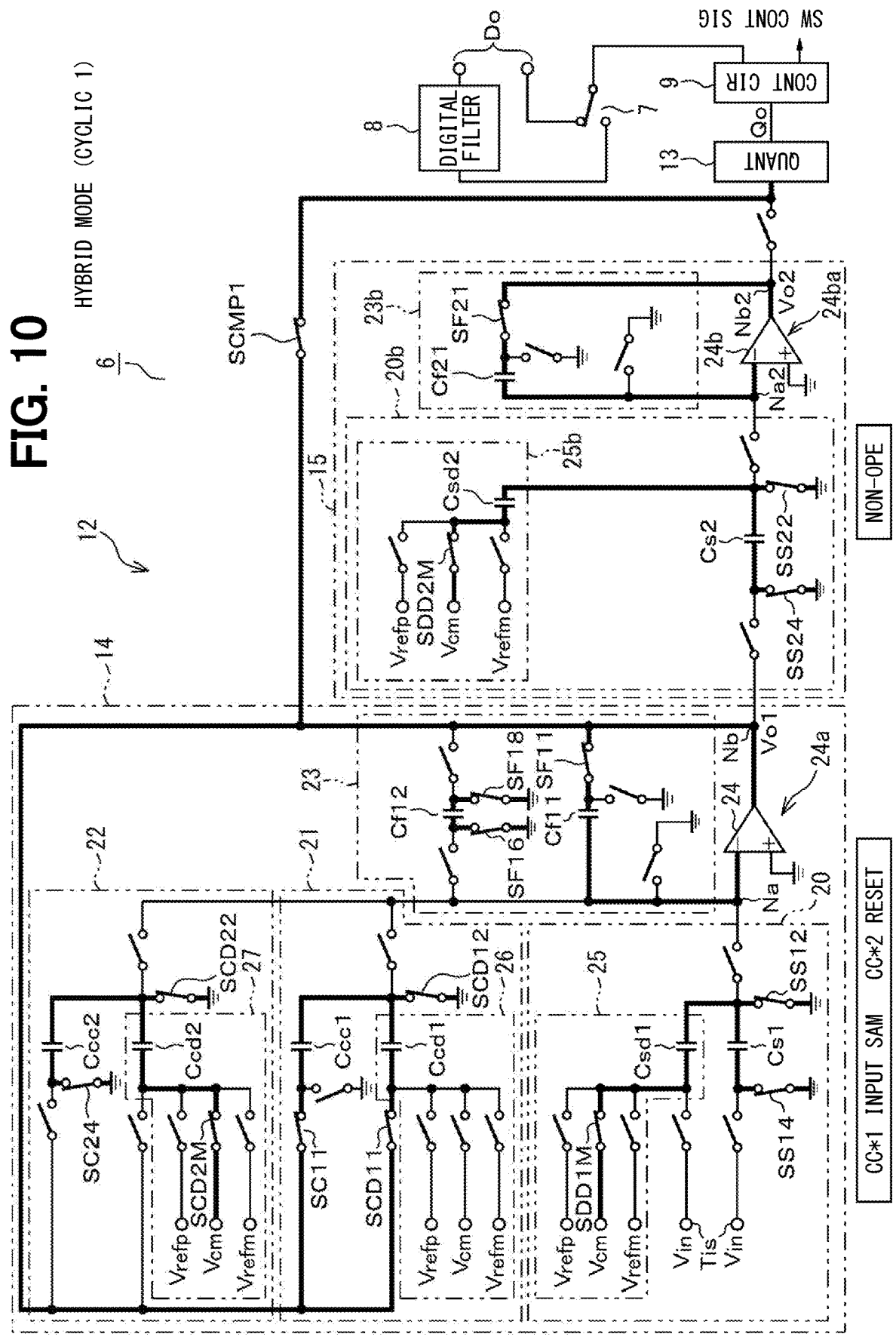
FIG. 10 is an explanatory diagram schematically showing one operation stage in the hybrid mode (Part 4)

After the A/D conversion device 6 amplifies the signal, the A/D conversion processing is performed by the cyclic method in S27 to S31 of FIG. 6. First, as shown in FIG. 10, the control circuit 9 turns on the switches SC24, SCD22, SCD2M to release the charge stored in the capacitors Ccc2, Ccd2 and make a reset. Also, the control circuit 9 turns on the switches SF11, SF16, SF18 to connect the capacitor Cf11 between the input node Na and the output node Nb of the operational amplifier 24 while releasing the charge stored in the capacitor Cf12 to make a reset.

The control circuit 9 turns on the switches SC11, SCD11, SCD12 to connect the node Nb to one end of the capacitors Ccc1, Ccd1, and samples the output voltage Vo1 of the first block 14 to the capacitors Ccc1, Ccd1.

<Cyclic Operation Part 2 in Hybrid Mode>

Figure 11:
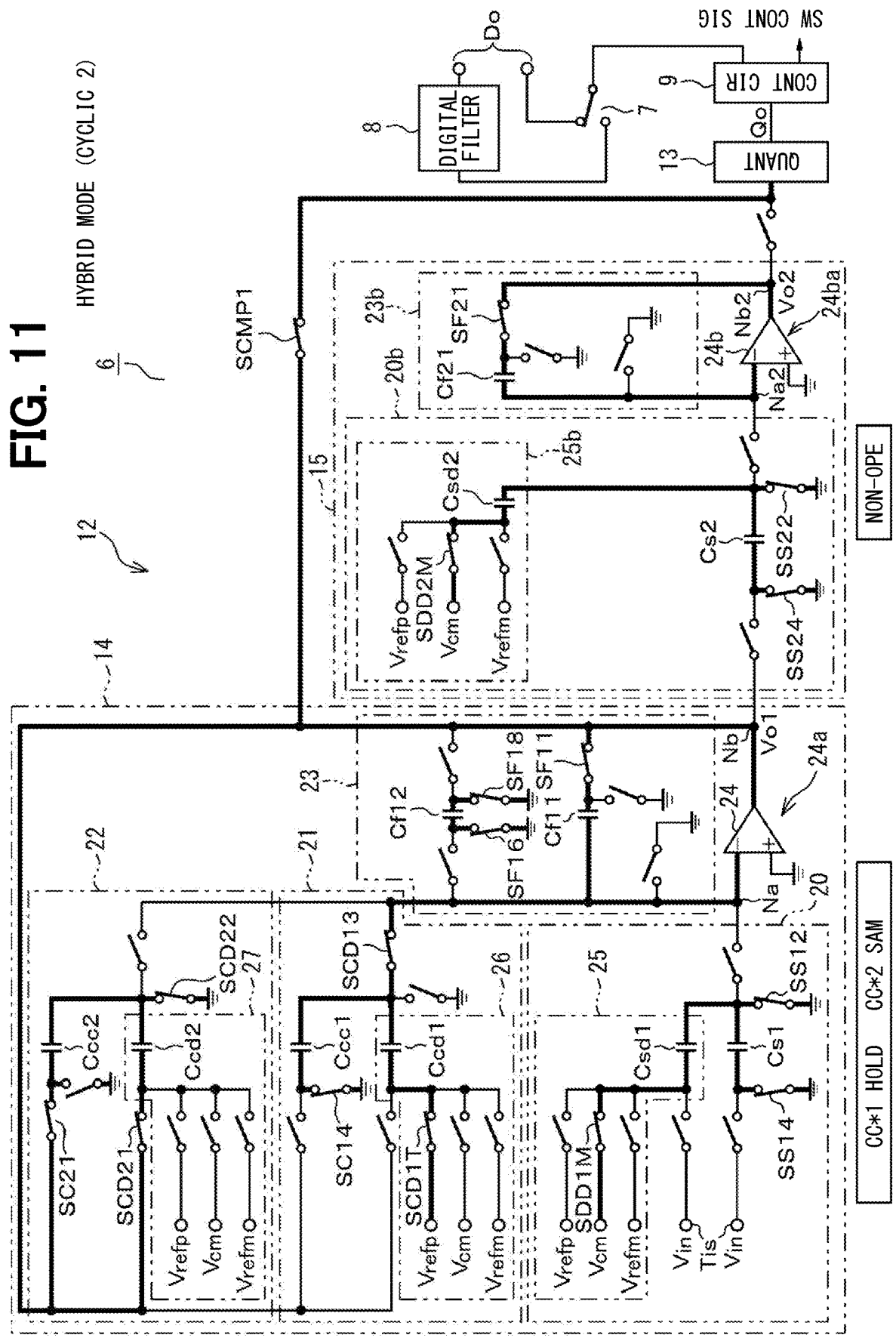
FIG. 11 is an explanatory diagram schematically showing one operation stage in the hybrid mode (Part 5)

Next, as shown in FIG. 11, the control circuit 9 turns on the switches SC14, SCD13 and the switch (here, assumed to be SCD1T) of the D/A converter 26 corresponding to the converted output VR of the quantization unit 13, whereby, one ends of the capacitors Ccc1, Ccd1 are connected to the input node Na of the operational amplifier 24. In the above-described cyclic operation Part 1, the output voltage Vo1 is sampled by the capacitors Ccc1, Ccd1, but in the cyclic operation Part 2, residual charge, obtained by subtracting the charge corresponding to the converted output VR from the stored charge of the capacitors Ccc1, Ccd1 and fed back, is transferred to the capacitor Cf11.

Thereby, the residual charge is stored into the capacitor Cf11.

At the same time, the control circuit 9 turns on the switches SC21, SCD21, SCD22 to connect the node Nb to one end of the capacitors Ccc2, Ccd2, and samples the output voltage Vo1 of the first block 14 to the capacitors Ccc2, Ccd2. As a result, the first block 14 can perform the cyclic sample operation by using the capacitor switching circuit 22 while performing the cyclic hold operation by using the capacitor switching circuit 21, and can simultaneously perform the cyclic sample operation and the cyclic hold operation.

<Cyclic Operation Part 3 in Hybrid Mode>

Figure 12:
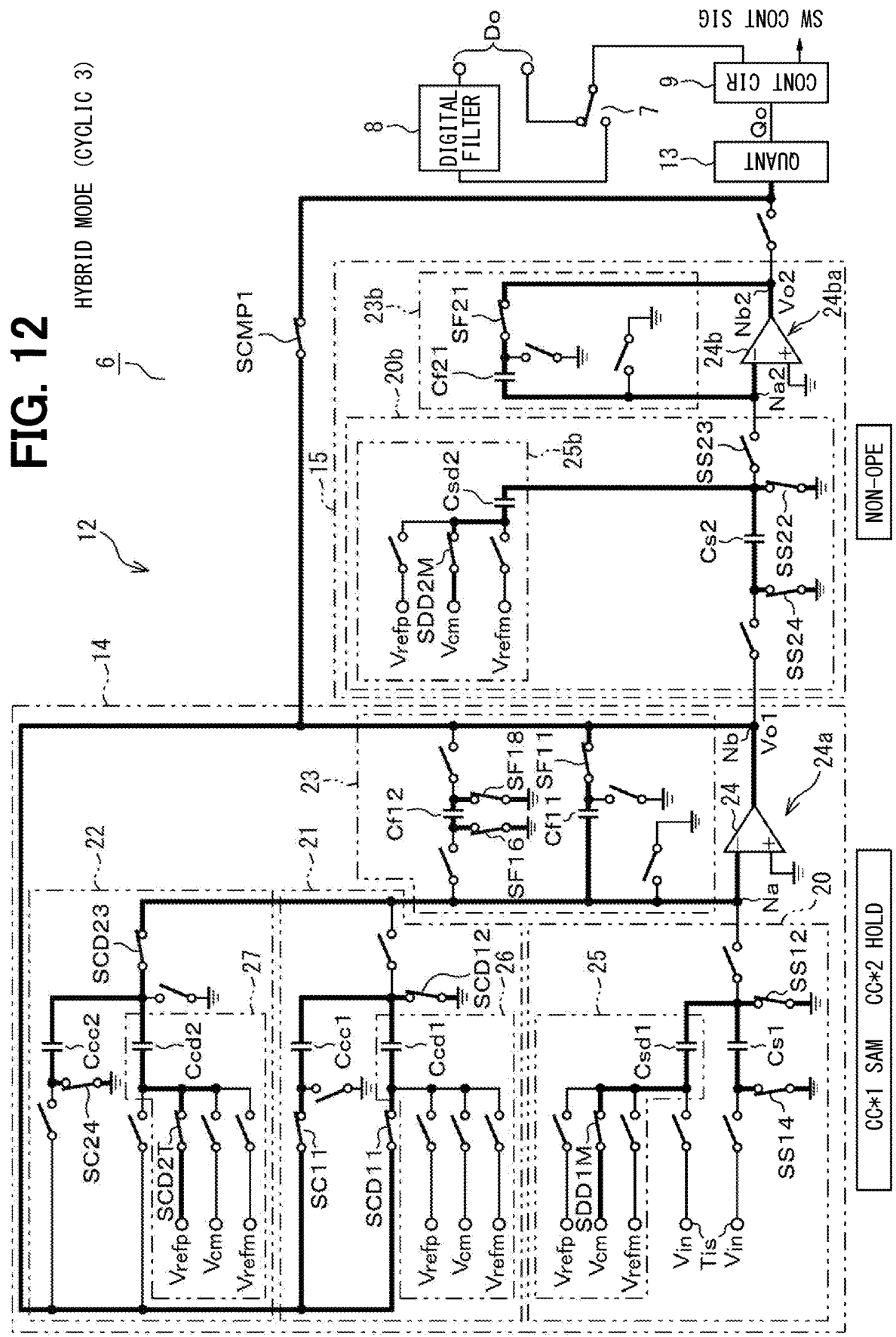
FIG. 12 is an explanatory diagram schematically showing one operation stage in the hybrid mode (Part 6)

Next, as shown in FIG. 12, the control circuit 9 turns on the switch (here, assumed to be SCD2T) of the D/A converter 27 corresponding to the converted outputs VR of the switches SC24, SCD23 and the quantization unit 13, to connect one ends of the capacitors Ccc2, Ccd2 to the inverting input terminal of the operational amplifier 24. In the above-described cyclic operation Part 2, the output voltage Vo1 is sampled in the capacitors Ccc2, Ccd2, but in the cyclic operation Part 3, residual charge, obtained by subtracting the charge corresponding to the converted output VR from the stored charge of the capacitors Ccc2, Ccd2 and fed back, is transferred to the capacitor Cf11. Thereby, the residual charge is stored into the capacitor Cf11.

At the same time, the control circuit 9 turns on the switches SC11, SCD11, SCD12 to connect the node Nb to one end of the capacitors Ccc1, Ccd1, and samples the output voltage Vo1 of the first block 14 to the capacitors Ccc1, Ccd1. As a result, the first block 14 can perform the cyclic sample operation by using the capacitor switching circuit 21 while performing the cyclic hold operation by using the capacitor switching circuit 22, and can simultaneously perform the cyclic sample operation and cyclic hold operation.

After that, the first block 14 repeats the cyclic operation Part 2 and the cyclic operation Part 3. Therefore, the control circuit 9 sequentially adds the quantized value Qo, obtained by the A/D conversion processing by the cyclic method after S27 as a low-order bit while shifting the order, to the high-order bit value generated by the ΔΣ method in S21 to S26, and the result of the addition is taken as the output data Do. In this way, a final A/D conversion result can be obtained.

(3) Cyclic Mode

Figure 13:
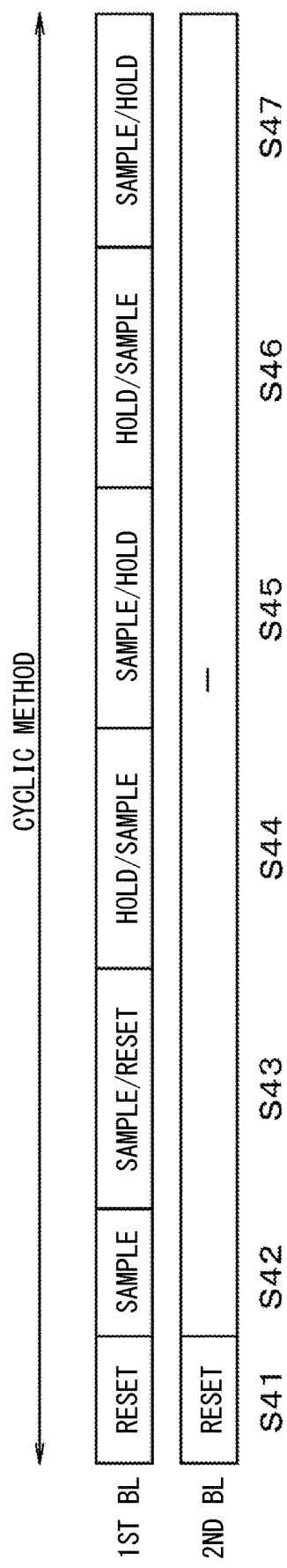
FIG. 13 is an explanatory diagram schematically showing a flow of processing for one cycle in a cyclic mode.

As shown in FIG. 13, in the cyclic mode, the A/D conversion device 6 performs the A/D conversion processing on the analog input signal Vin by the cyclic method, using the configuration of the first block 14 without using the second block 15.

<Reset Operation in Cyclic Mode>

First, in S41, the control circuit 9 simultaneously performs the reset operation on the first block 14 and the second block 15. The processing operation at this time is the same as that of the reset operation in the ΔΣ mode shown in FIG. 3, and hence a description thereof will be omitted. Thereafter, in S42 to S47, the A/D conversion device 6 alternately repeats the cyclic sample operation and the cyclic hold operation of the cyclic method by a predetermined number of times (e.g., a few dozen times) by using only the first block 14.

<Cyclic Sample Operation in Cyclic Mode>

Figure 14:
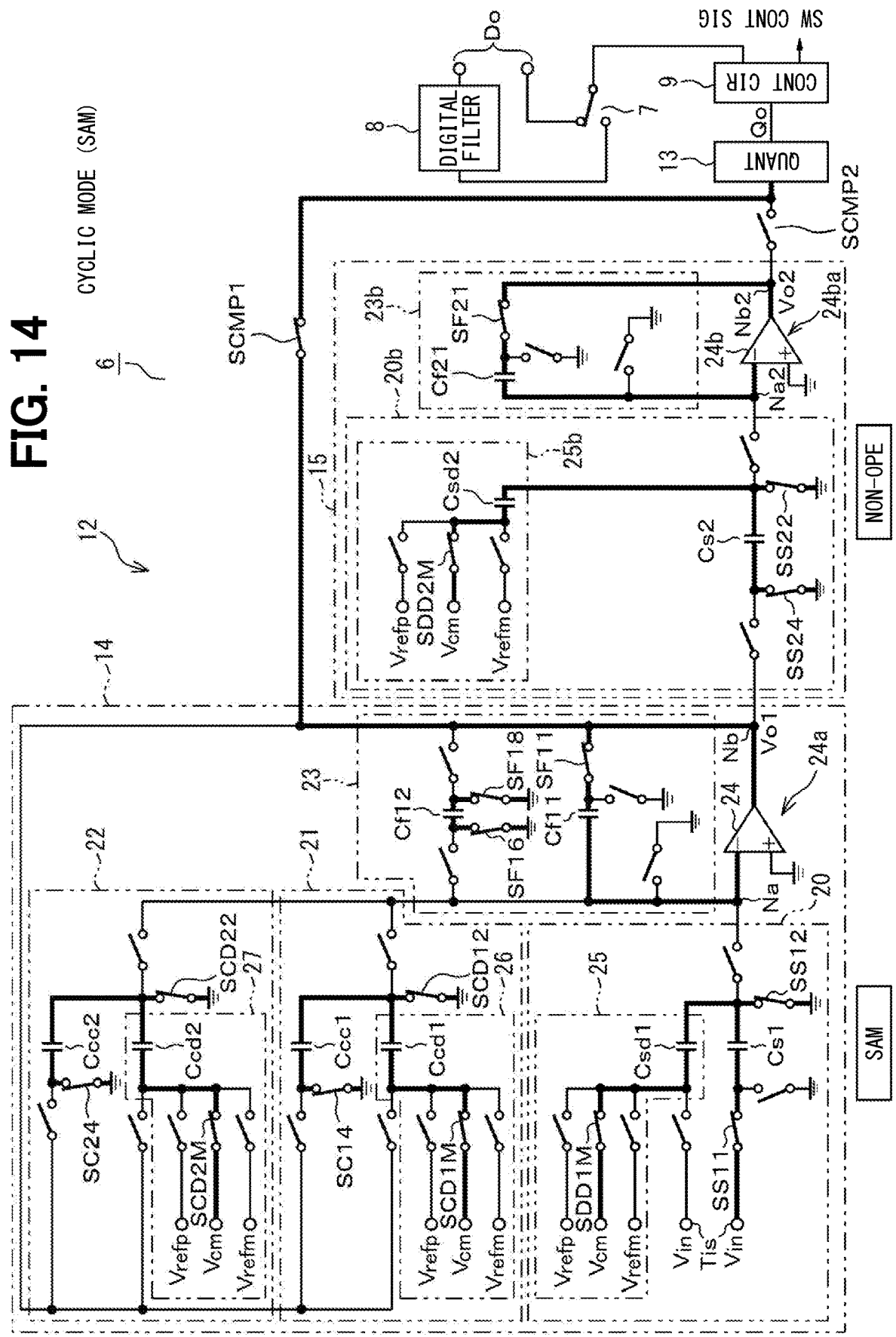
FIG. 14 is an explanatory diagram schematically showing one operation stage in the cyclic mode (Part 1)

As shown in FIG. 14, the control circuit 9 turns on the switches SDD1M, SS11, SS12 of the first block 14 to cause the capacitor Cs1 to sample the analog input signal Vin. At the same time, the control circuit 9 turns on the switches SF11, SF16, SF18 to connect the capacitor Cf11 between the input node Na and the output node Nb of the operational amplifier 24. The control circuit 9 turns on the switch SCMP1 to input the output voltage Vo1 of the node Nb to the quantization unit 13.

Figure 15:
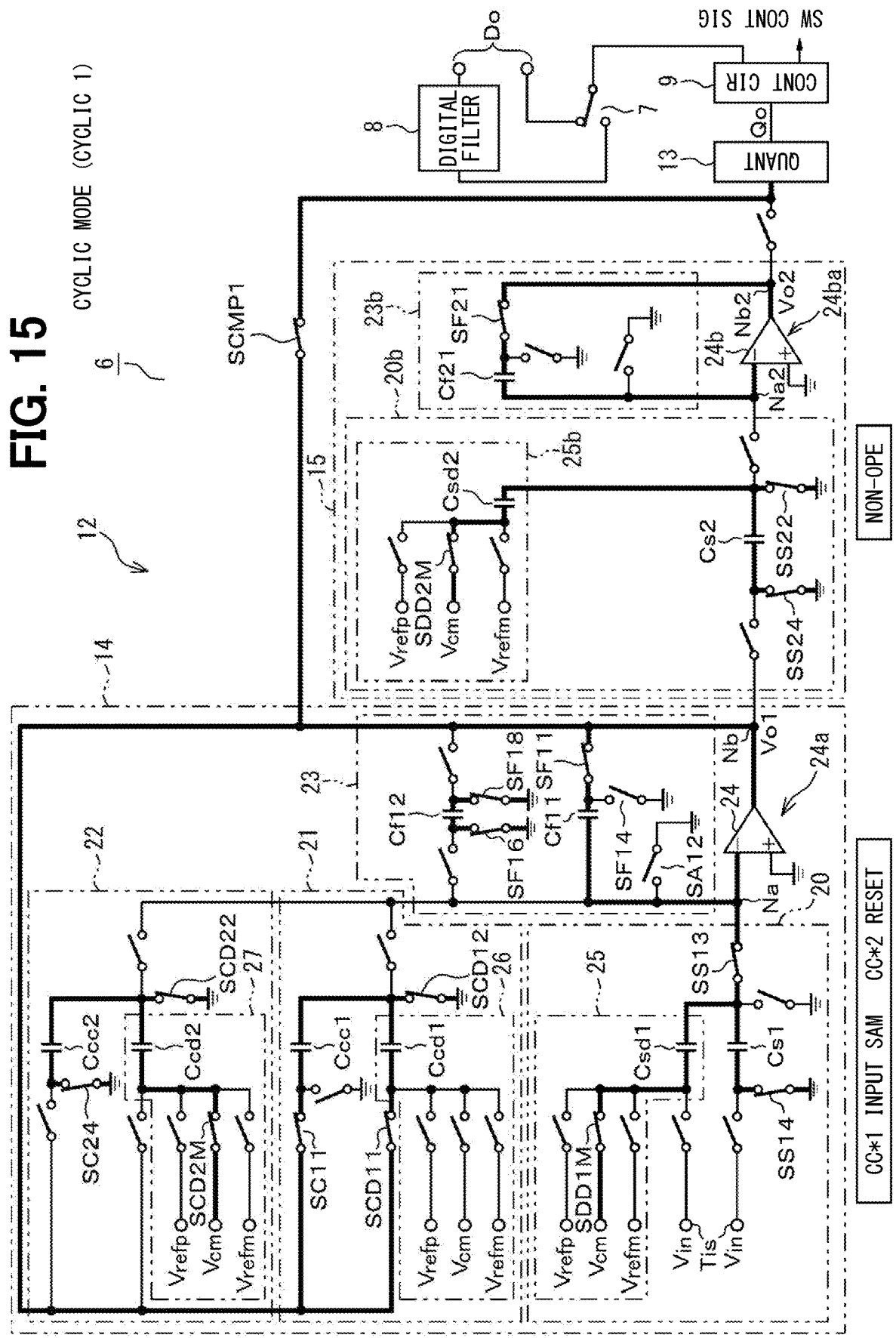
FIG. 15 is an explanatory diagram schematically showing one operation stage in the cyclic mode (Part 2)

Next, as shown in FIG. 15, the control circuit 9 turns on the switches SS13, SS14 to transfer the charge stored in the capacitor Cs1 to the capacitor Cf11. At the same time, the control circuit 9 turns on the switches SC11, SCD11, SCD12 to connect the node Nb to one end of the capacitors Ccc1, Ccd1, and samples the output voltage Vo1 of the first block 14 to the capacitors Ccc1, Ccd1. Thereby, the first block 14 can perform the cyclic sample operation by using the capacitor switching circuit 21.

Thereafter, the first block 14 repeats the same operations as <cyclic operation Part 2 in hybrid mode> and <cyclic operation Part 3 in hybrid mode>. This is the same as described above, and a description thereof will be omitted. Thus, the A/D conversion processing can be performed by the cyclic method, using the first block 14 without using the second block 15.

Summary of the Present Embodiment

According to the present embodiment, the A/D conversion device 6 performs the A/D conversion processing by using the first block 14 and the second block 15 in the ΔΣ mode, and performs the A/D conversion processing by using only the first block 14 in the hybrid mode and the cyclic mode. Thereby, in the modes except for the ΔΣ mode, that is, the hybrid mode and the cyclic mode, the A/D conversion device 6 does not need to operate the second block 15, and does not need to employ a high-gain amplifier for the operational amplifier 24b in the second block 15. As a result, the configuration area for the second block 15 can be made small and the current consumption can be reduced as compared to the related art.

In the hybrid mode and the cyclic mode, since the second block 15 is not used, an operational amplifier with a low gain error can be used for the operational amplifier 24b of the second block 15 as compared to that for the operational amplifier 24 of the first block 14.

In the present embodiment, in the A/D conversion device 6, the capacitor Csd1 is used as a sampling capacitor in the ΔΣ mode, and the capacitor Cs1 is used as a sampling capacitor in the hybrid mode and the cyclic mode. That is, when the capacitance values of the capacitors Cs1, Csd1 are set to capacitance value different from each other, the input sampling capacitance value can be switched between the ΔΣ mode and other modes.

In general, when the ΔΣ mode is employed, the A/D conversion accuracy becomes higher than that in the cyclic mode due to the effect of oversampling, but even if the capacitance value of the sampling capacitor Csd1 is reduced when the ΔΣ mode is employed, the A/D conversion accuracy can be maintained. In this case, the configuration area for the sampling capacitor Csd1 can be minimized. Conversely, the A/D conversion accuracy in the ΔΣ mode can be further improved by setting a large capacitance value of the sampling capacitor Csd1.

Second Embodiment

Figure 16:
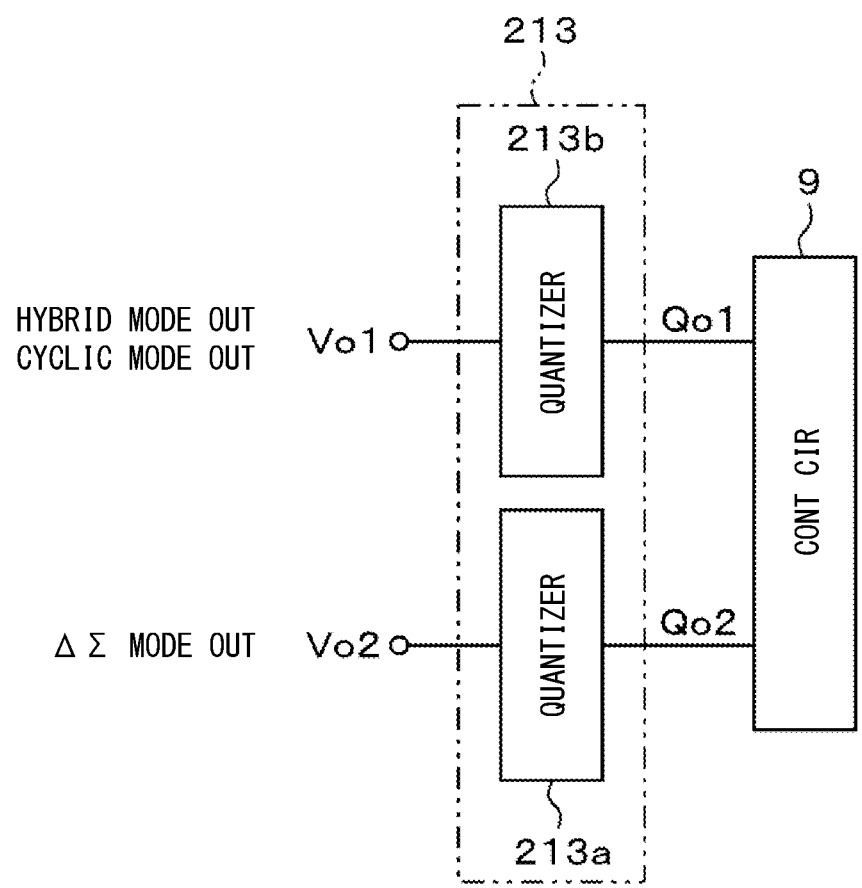
FIG. 16 is an electrical configuration diagram of a quantization unit showing a second embodiment.

As shown in FIG. 16, a quantization unit 213 may be provided instead of the quantization unit 13. The quantization unit 213 includes a first quantizer 213a that quantizes the output voltage Vo2 of the second block 15 in the ΔΣ mode, and a second quantizer 213b that quantizes the output voltage Vo1 of the first block 14 in the modes except for the ΔΣ mode (i.e., for example, hybrid mode, cyclic mode).

The first quantizer 213a is constituted by an A/D converter and outputs a converted output Qo1, obtained by quantizing the output voltage Vo1, to the control circuit 9. The control circuit 9 turns on or off the switches of the D/A converter 25 to 27 of the first block 14 in accordance with the converted output Qo1 of the first quantizer 213a in the hybrid mode and the cyclic mode. The second quantizer 213b is constituted by an A/D converter and outputs a converted output Qo2 of the second quantizer 213b, obtained by quantizing the output voltage Vo2, to the control circuit 9.

The control circuit 9 turns on or off the respective switches of the D/A converters 25 to 27 and 25b of the first block 14 and the second block 15 in accordance with the converted output Qo2 of the second quantizer 213b in the ΔΣ mode. Thus, the first quantizer 213a and the second quantizer 213b can be used separately for each mode.

Third Embodiment

Figure 17:
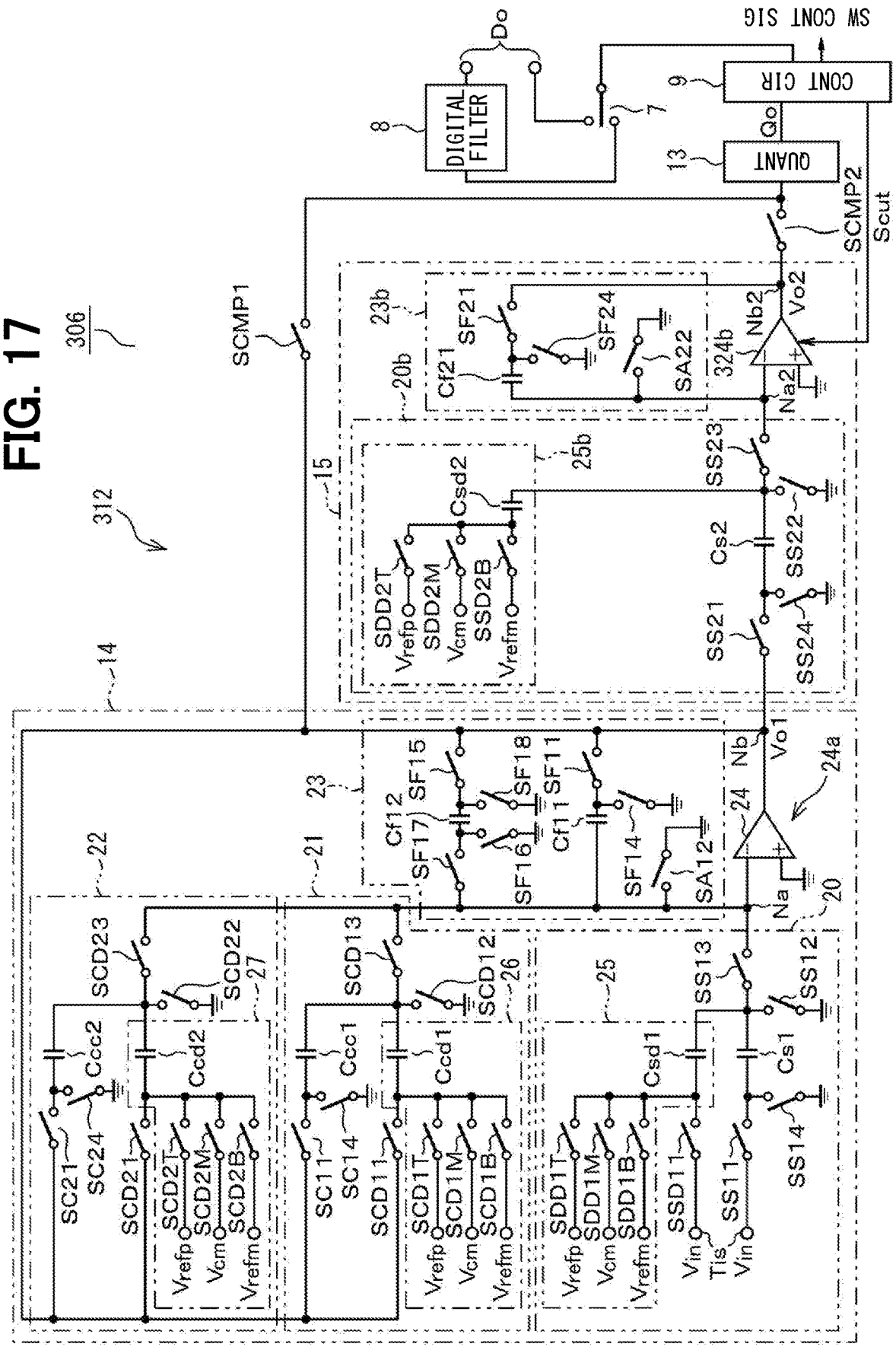
FIG. 17 is an electrical configuration diagram of an A/D conversion device showing a third embodiment.

FIG. 17 shows an electrical configuration of an A/D conversion device 306 according to the third embodiment. The A/D conversion device 306 includes a signal processing unit 312. The signal processing unit 312 has substantially the same configuration as the signal processing unit 12, except that an operational amplifier 324b is provided in place of the operational amplifier 24b. The operational amplifier 324b is configured to be operable with low power consumption.

As described in the first embodiment, in the hybrid mode and the cyclic mode except for the ΔΣ mode, the second block 15 is in a non-operating state. For this reason, as shown in FIG. 17, the control circuit 9 preferably shifts the operational amplifier 324b to a sleep state by outputting a current cut signal Scut to the operational amplifier 324b of the second block 15. As a result, the operating current of the operational amplifier 324b can be cut, and the operating current can be reduced in the modes except for the ΔΣ mode.

Figure 18:
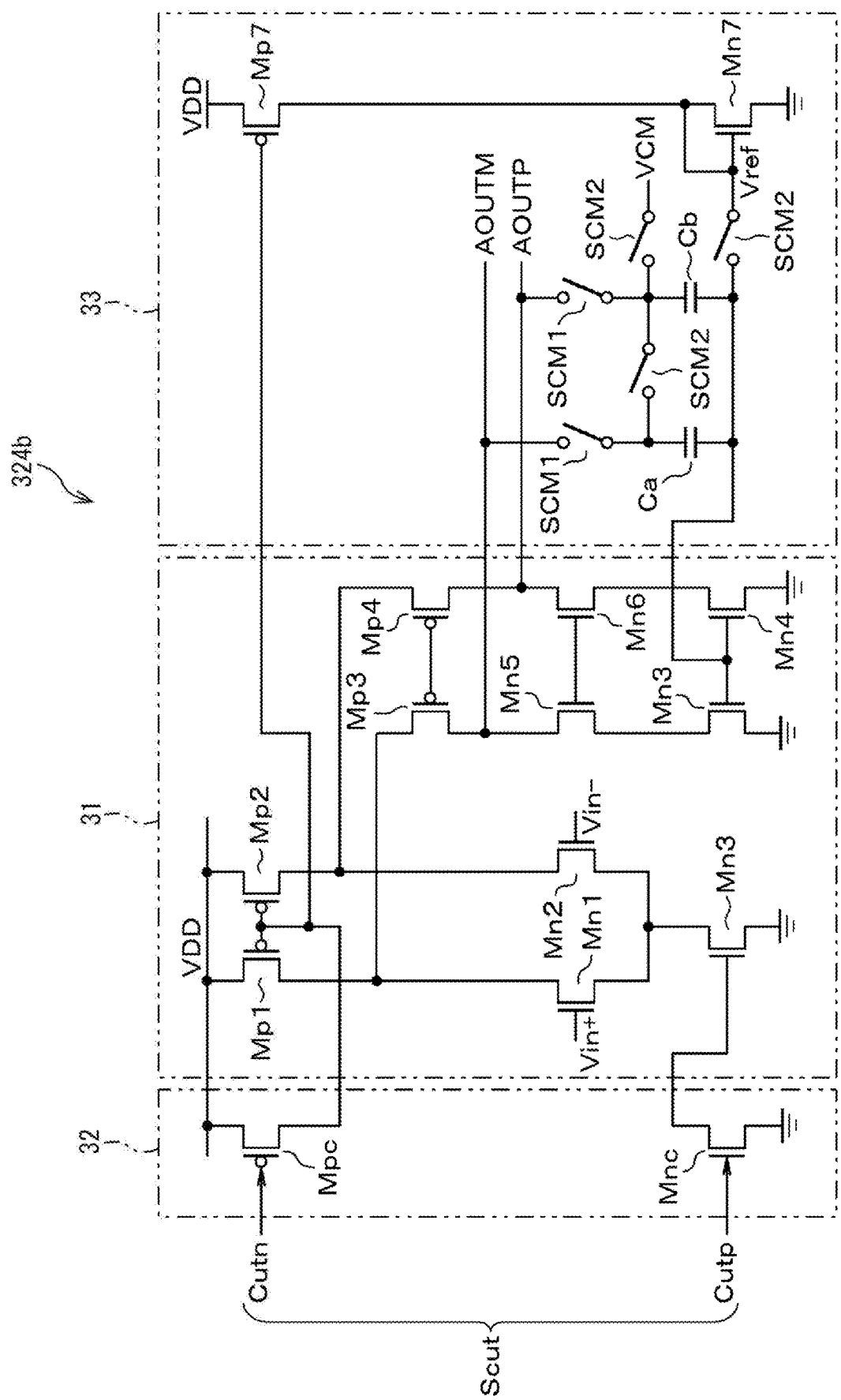
FIG. 18 is an electrical configuration diagram of the inside of an amplifier.

As shown in FIG. 18, the operational amplifier 324b includes an input amplification stage 31, a current cut unit 32, and a discrete-time common mode feedback circuit 33 (hereinafter abbreviated as CMFB circuit 33). The input amplification stage 31 is constituted by combining p-channel MOSFETs Mp1 to Mp4 and n-channel MOSFETs Mn1 to Mn6 in the illustrated form, and is configured in a so-called folded cascode type. The circuit topology of the input amplification stage 31 is not limited to the illustrated form.

The current cut unit 32 is formed by constituting a p-channel MOSFET_Mpc and an n-channel MOSFET_Mnc in the illustrated form, and is configured so that the input amplification stage 31 can be switched to be effective or ineffective by adjusting a bias voltage applied to the input amplification stage 31.

When receiving an input of the current cut signal Scut from the control circuit 9, the operational amplifier 324b generates a signal Cutp/Cutn complementarily changing from the current cut signal Scut by using an inverter or the like, and applies the generated signal to the p-channel MOSFET_Mpc and the n-channel MOSFET_Mnc of the current cut unit 32. The current cut unit 32 can reduce the current consumed in the input amplification stage 31 by cutting off the conduction path of the input amplification stage 31.

The CMFB circuit 33 includes switches SCM1, SCM2, a p-channel MOSFET_Mp7, an n-channel MOSFET_Mn7, and capacitors Ca, Cb in the illustrated form. The circuit topology of the CMFB circuit 33 is not limited to the illustrated form.

The control circuit 9 applies a control signal to the switches SCM1, SCM2 to complementarily turn on or off the switches SCM1, SCM2. Then, the input amplification stage 31 can hold the average voltage (AOUTP+AOUTM)/2 of its output analog voltages AOUTM, AOUTP at a predetermined voltage VCM, and the CMFB circuit 33 can feed back the average value of the output voltage Vo2 of the operational amplifier 324*b* so as to hold the average value at the predetermined voltage VCM during normal operation.

When the control circuit 9 stops the operation of the CMFB circuit 33 by stopping the control signals applied to the switches SCM1, SCM2 while the current cut unit 32 is cutting the current of the input amplification stage 31, the output analog voltages AOUTP, AOUTM may also be fixed to a power supply voltage VDD or the ground level. In this case, it takes a certain amount of recovery time for the CMFB circuit 33 to be restored to the same operating state as the normal state, and for the average voltage (AOUTP+AOUTM)/2 of the output analog voltages AOUTM, AOUTP to reach the predetermined voltage VCM.

Therefore, the control circuit 9 desirably continues to operate the CMFB circuit 33 by continuously outputting control signals to be applied to the switches SCM1, SCM2 even when the current of the input amplification stage 31 is cut by the current cut unit 32.

Then, even when the operational amplifier 324*b* is operating at low power by the action of the current cut unit 32, the control circuit 9 terminates the cut operation by the current cut unit 32, so that the operational amplifier 324*b* can be immediately restored in operation, and the recovery time until the operational amplifier 324*b* is restored to the normal operation can be reduced.

Although not shown here, especially when the first block 14 requires a high-gain amplifier in the hybrid mode, it is preferable to add the operational amplifier 24 of the first block 14 to the configuration of input amplification stage 31 of the folded cascode type shown in FIG. 18.

The gain boost amplifier is constituted by using a fully differential OP amplifier which sets the drains of MOSFETs_Mn3, Mn4 as the input and connects the gates of MOSFETs_Mn5, Mn6 to the output, and a fully differential OP amplifier which sets the sources of MOSFETs_Mp3, Mp4 as the input and connects the gates of MOSFETs_Mn3, Mn4 to the output.

However, since the second block 15 is not required in the hybrid mode, it is not necessary to constitute a gain boost amplifier in the operational amplifier 324*b* of the second block 15, and the configuration area for the gain boost amplifier circuit can be reduced. Moreover, current consumption can be reduced.

According to the present embodiment, since the control circuit 9 operates the CMFB circuit 33 of the operational amplifier 324*b* of the second block 15 and does not operate the input amplification stage 31 which is the other circuit, the current consumption can be cut when the second block 15 is not operated, and the operation can be quickly restored when the operational amplifier 324*b* of the second block 15 is switched to the required mode, that is, the $\Delta\Sigma$ mode.

Fourth Embodiment

Figure 19:
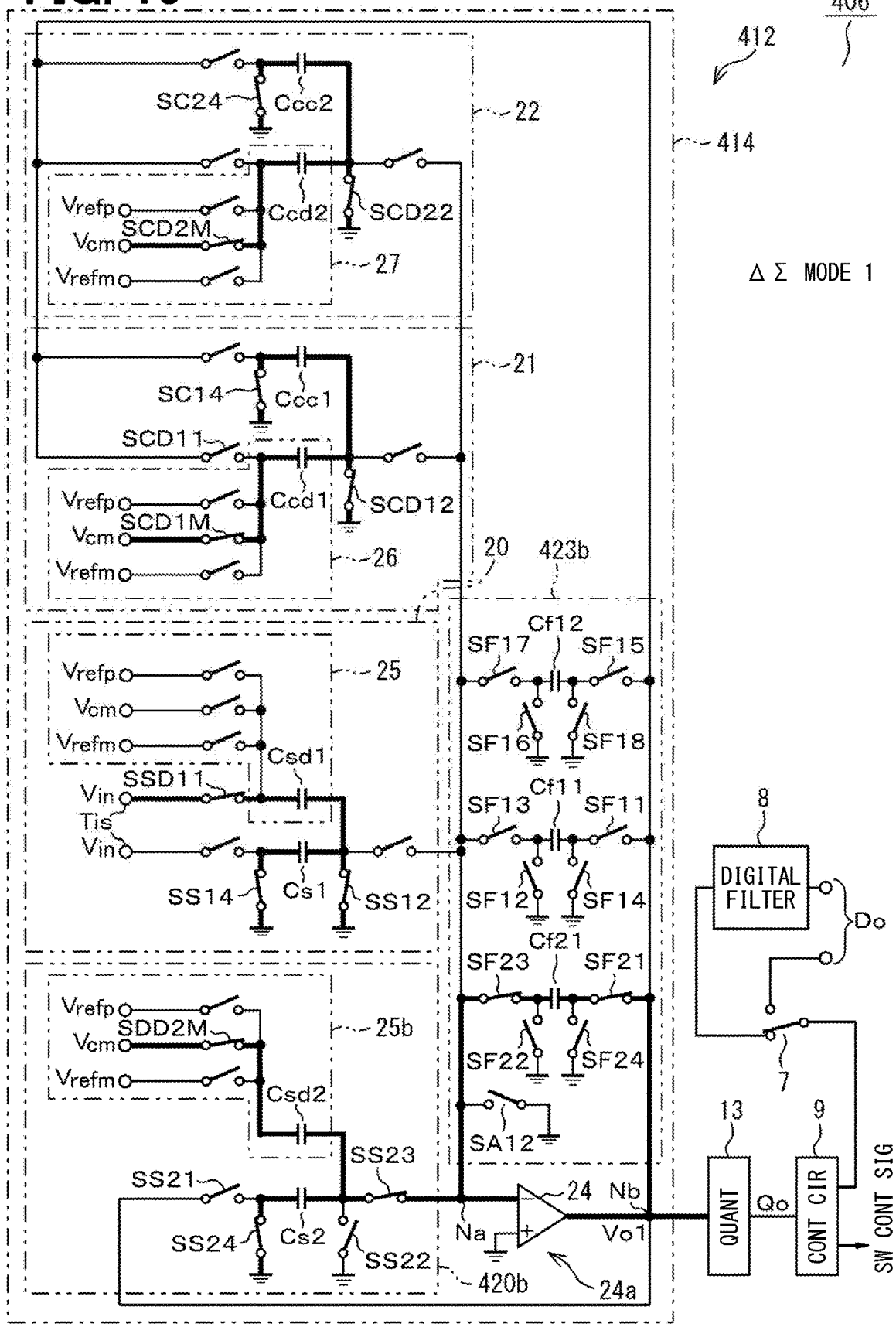
FIG. 19 is an electrical configuration diagram of an A/D conversion device showing a fourth embodiment, and an explanatory diagram schematically showing one operation stage in the $\Delta\Sigma$ mode (Part 1)

An A/D conversion device 406 shown in FIG. 19 includes a signal processing unit 412, the quantization unit 13, and the control circuit 9. The signal processing unit 412 of the present embodiment is made up of one block 414. The block 414 will be described focusing on portions different from those of the first block 14 in the first embodiment.

The block 414 includes capacitor switching circuits 20 to 22, 420*b*, 423*b*, and an operational amplifier 24. The capacitor switching circuits 20 to 22 have the same configuration as the capacitor switching circuits 20 to 22 inside the first block 14 described in the first embodiment. The D/A converter 25 is equivalent to the first D/A converter, and the capacitor Csd1 is equivalent to the first capacitor. The capacitor Cs1 is equivalent to the first sampling capacitor. The capacitor switching circuit 20 is equivalent to the first capacitor switching circuit that enables charging/discharging of the capacitor Csd1 constituting the D/A converter 25.

The capacitor switching circuit 420*b* includes switches SS21 to SS24, a capacitor Cs2, and a D/A converter 25*b*. The D/A converter 25*b* is equivalent to the second D/A converter and has the same configuration as the D/A converter 25*b* inside the second block 15 described in the first embodiment, but the connection is different. The capacitor Csd2 is equivalent to the second capacitor. The capacitor switching circuit 420*b* is equivalent to the second capacitor switching circuit that enables charging/discharging of the capacitor Csd2 constituting the D/A converter 25*b*.

One terminal of the capacitor Cs2 is connected to the node Nb via the switch SS21, and is connected to the analog ground line via the switch SS24. The other terminal of the capacitor Cs2 is connected to the node Na via the switch SS23, and is connected to the analog ground line via the switch SS22.

The D/A converter 25*b* includes a plurality of switches SDD2T, SDD2M, SDD2B, and a capacitor Csd2. The other terminal of the capacitor Cs2 is connected to the node Na via the switch SS23, and is connected to the analog ground line via the switch SS22. The control circuit 9 selectively turns on the switches SDD2T, SDD2M, SDD2B to apply any of the converted outputs Vrefp, Vcm, Vrefm of the quantization unit 13 to the other terminal of the capacitor Csd2. The capacitor switching circuit 423*b* is constituted by combining the capacitor switching circuit 23 and the capacitor switching circuit 23*b* described in the first embodiment, and includes switches SF11 to SF14, SF15 to SF18, SF21 to SF24, SA12, and capacitors Cf11, Cf12, Cf21.

The capacitors Cf11, Cf12, Cf21 are configured as feedback capacitors between an input node Na and an output node Nb of the operational amplifier 24. One terminal of the capacitor Cf11 is connected to the node Na via the switch SF13, and is connected to the analog ground line via the switch SF12. The other terminal of the capacitor Cf11 is connected to the node Nb via the switch SF11, and is connected to the analog ground line via the switch SF14.

One terminal of the capacitor Cf12 is connected to the node Na via the switch SF17, and is connected to the analog ground line via the switch SF16. The other terminal of the capacitor Cf12 is connected to the node Nb via the switch SF15, and is connected to the analog ground line via the switch SF18.

One terminal of the capacitor Cf21 is connected to the node Na via the switch SF23, and is connected to the analog ground line via the switch SF22. The other terminal of the capacitor Cf21 is connected to the node Nb via the switch SF21, and is connected to an analog ground line via the switch SF24. The node Na is connected to the analog ground line via the switch SA12.

The output voltage Vo1 of the node Nb is input to the quantization unit 13. The quantization unit 13 is configured using one A/D converter. The other configuration is the same as that of the first embodiment, and hence the description will be omitted.

(1) ΔΣ Mode

In the ΔΣ mode, the A/D conversion device 406 repeats the ΔΣ sample operation and the ΔΣ hold operation after performing the reset operation. At this time, in the A/D conversion device 406, the quantization unit 213 continues digital output while the ΔΣ sample operation and the ΔΣ hold operation are oversampled a predetermined number of times to perform the A/D conversion processing, and the digital filter 8 low-pass filters the output value of the quantization unit 13 to generate output data Do.

<Reset Operation in ΔΣ Mode>

Although the reset operation is not shown, the control circuit 9 performs on/off-control of each switch to release the charge stored in all the capacitors Cs1, Csd1, Cs2, Csd2, Cf11, Cf12, Cf21. The control circuit 9 performs resetting processing on the digital filter 8 before setting the ΔΣ mode.

<Operation Part 1 in ΔΣ Mode: Equivalent to First ΔΣ Operation>

As shown in FIG. 19, the control circuit 9 turns on the switches SSD11, SS12, SS14 to cause the capacitor Csd1 (equivalent to the first capacitor) to sample the analog input signal Vin.

Further, the control circuit 9 turns on the switches SF21, SF23 to connect the capacitor Cf2 between the input/output terminal of the operational amplifier 24.

The capacitor switching circuits 21, 22 hold the charges stored in the capacitors Ccc1, Ccd1, Ccc2, Ccd2 in the reset state.

<Operation Part 2 in ΔΣ Mode: Equivalent to the Second ΔΣ Operation>

Figure 20:
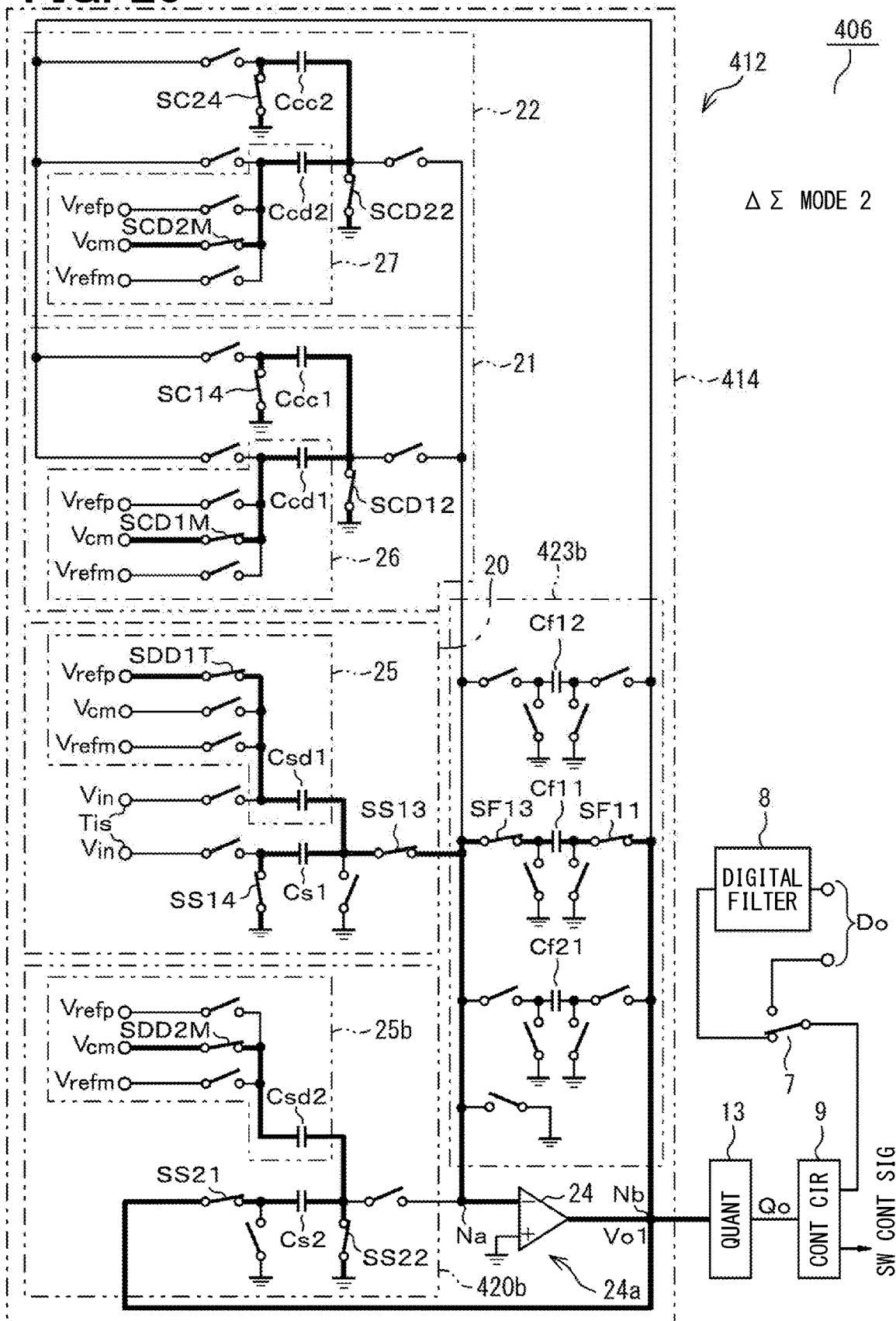
FIG. 20 is an explanatory diagram schematically showing one operation stage in the $\Delta\Sigma$ mode (Part 2)

As shown in FIG. 20, the control circuit 9 turns on switches SS14, SS13 and the switch (here, assumed to be SDD1T) of the D/A converter 25 corresponding to the converted output VR to connect one ends of the capacitors Cs1, Csd1 to the input node Na of the operational amplifier 24. Further, the control circuit 9 turns on the switches SF11, SF13 to connect the capacitor Cf11 between the input node Na and the output node Nb of the operational amplifier 24.

In the ΔΣ mode operation Part 1, the analog input signal Vin is sampled by the capacitor Csd1, but in operation Part 2 of the ΔΣ mode, residual charge, obtained by subtracting the charge corresponding to the converted output VR from the stored charge of the capacitor Csd1 and fed back, is transferred to the capacitor Cf11. Thereby, the residual charge is stored into the capacitor Cf11. At the same time, the control circuit 9 turns on the switches SS21, SS22, SDD2M to cause the capacitor Cs2 (equivalent to the second sampling capacitor) to sample the output voltage Vo1.

Thus, the block 414 calculates an integrated voltage corresponding to the stored charge of the capacitor Cf1 obtained by the integrator 24a, and can output the output voltage Vo1 from the node Nb to the quantization unit 13 and can sample the output voltage Vo1 to the capacitor Cs2.

<Operation Part 3 in ΔΣ Mode: Equivalent to Third ΔΣ Operation>

Figure 21:
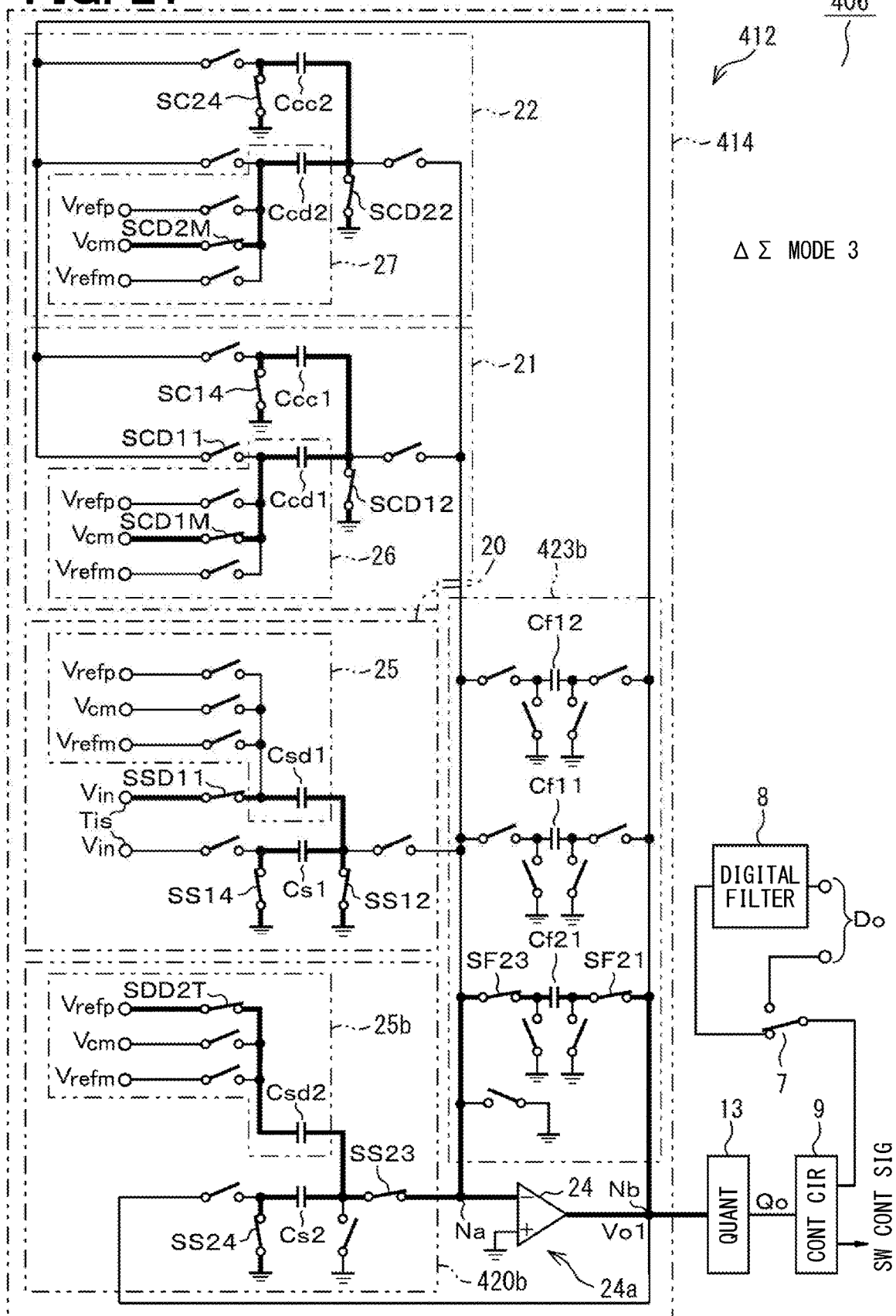
FIG. 21 is an explanatory diagram schematically showing one operation stage in the $\Delta\Sigma$ mode (Part 3)

As shown in FIG. 21 again, the control circuit 9 turns on the switches SSD11, SS12, SS14 to cause the capacitor Csd1 to sample the analog input signal Vin.

At the same time, the control circuit 9 turns on the switch (here, assumed to be SDD2T.) of the D/A converter 25b corresponding to the switches SS24, SS23 and the converted output VR to connect one end of the capacitors Cs2, Csd2 to the inverting input terminal of the operational amplifier 24. Further, the control circuit 9 turns on the switches SF21, SF23 to connect the capacitor Cf21 between the input node Na and the output node Nb of the operational amplifier 24. Thus, the block 414 can calculate the integrated voltage corresponding to the stored charge of the capacitor Cf21 obtained by the integrator 24a, and output the output voltage Vo1 from the node Nb to the quantization unit 13.

At the timing of <Operation Part 2 in ΔΣ mode> described above, the charge can be sampled in the capacitor Cs2, but at the timing of <Operation Part 3 in ΔΣ mode>, residual charge, obtained by subtracting the charge corresponding to the converted output VR of the quantization unit 13 from the stored charge of the capacitor Cs2 and fed back, is transferred to the capacitor Cf21. Thereby, the residual charge is stored into the capacitor Cf21.

Also, thereafter, the block 414 repeatedly executes <Operation Part 2 in ΔΣ mode> and <Operation Part 3 in ΔΣ mode> described above only a predetermined number of times. While the control circuit 9 of the A/D conversion device 406 oversamples these operations, the quantization unit 13 continues to output a value, and the digital filter 8 low-pass filters the output value of the quantization unit 13 to generate output data Do.

(2) Hybrid Mode

In the hybrid mode according to the present embodiment, the control circuit 9 switches each switch in the block 414 in accordance with the switching processing for each switch in the first block 14 of the hybrid mode according to the first embodiment.

<ΔΣ Sample Operation in Hybrid Mode: Equivalent to Fourth ΔΣ Operation>

Figure 22:
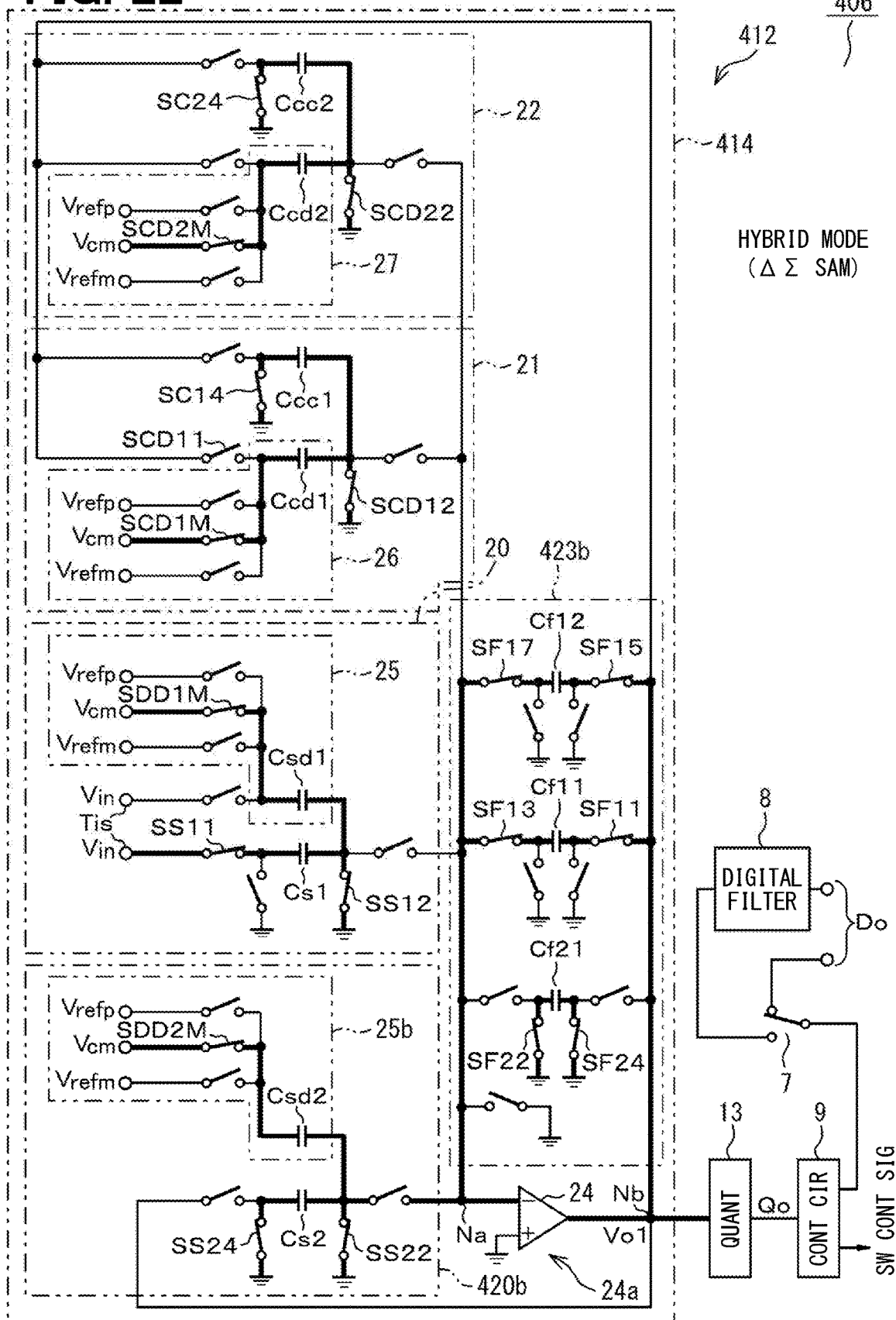
FIG. 22 is an explanatory diagram schematically showing one operation stage in the hybrid mode (Part 1)

In block 414, after <Reset operation in ΔΣ mode> described above is performed, the control circuit 9 turns on the switches SDD1M, SS11, SS12 to cause the capacitor Cs1 (equivalent to the first sampling capacitor) to sample the analog input signal Vin, as shown in FIG. 22 At the same time, the control circuit 9 turns on the switches SF11, SF13, SF15, SF17 to connect the capacitors Cf11, Cf12 in parallel between the input node Na and the output node Nb of the operational amplifier 24.

<ΔΣ Hold Operation in Hybrid Mode: Equivalent to Fifth ΔΣ Operation>

Figure 23:
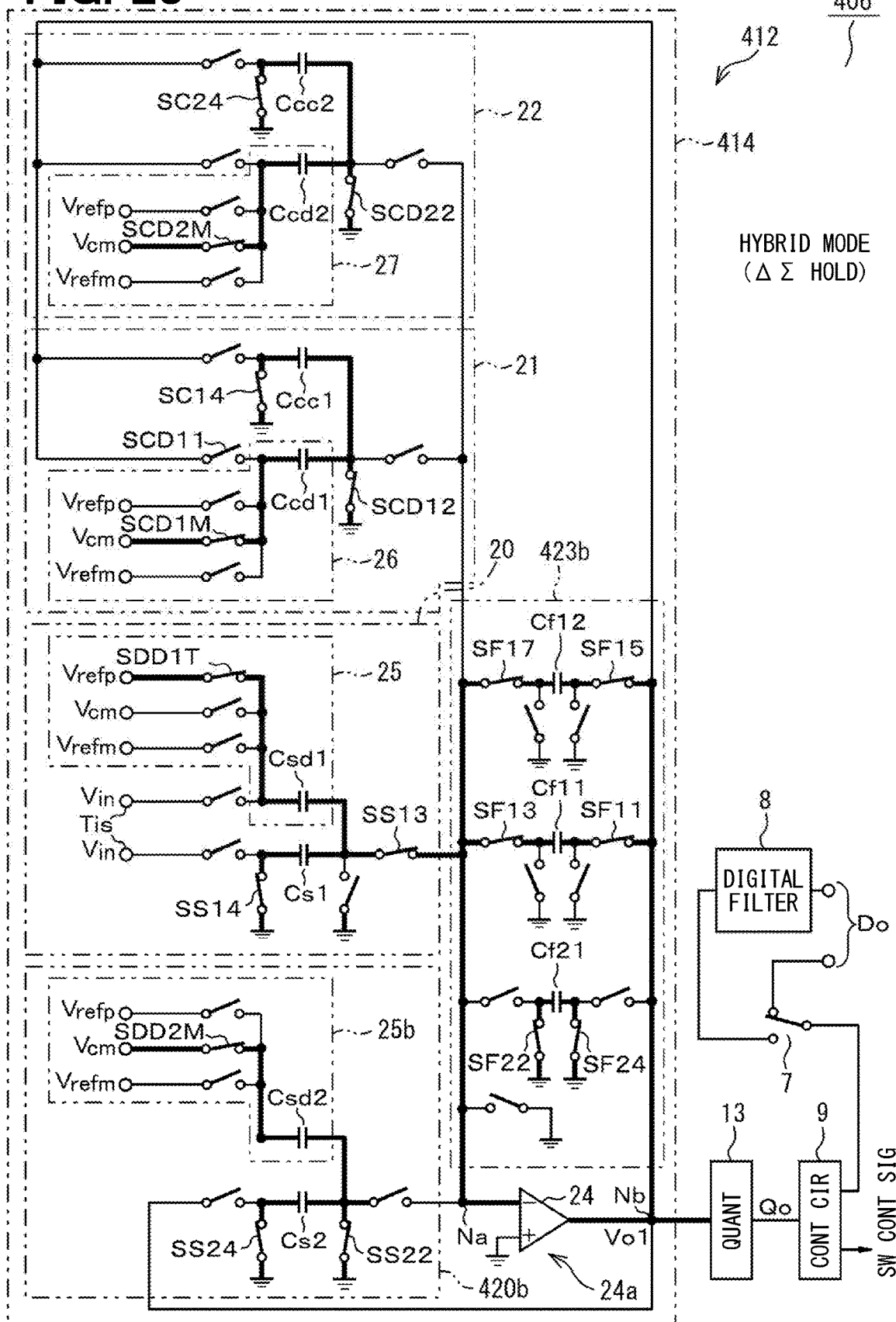
FIG. 23 is an explanatory diagram schematically showing one operation stage in the hybrid mode (Part 2)

Thereafter, as shown in FIG. 23, the control circuit 9 turns on the switches SS14, SS13 of the block 414 and the switch (here, assumed to be SDD1T.) of the D/A converter 25 corresponding to the converted output VR to connect one ends of the capacitors Cs1, Csd1 to the inverting input terminal of the operational amplifier 24.

During the above-described ΔΣ sample operation, charge is stored into the capacitor Cs1, but during the ΔΣ hold operation, residual charge, obtained by subtracting the charge corresponding to the converted output VR from the stored charge of the capacitor Cs1 and fed back, is transferred to the capacitors Cf11, Cf12.

Thereby, the residual charge is stored into the capacitors Cf11, Cf12, and the block 414 outputs from the node Nb an integrated voltage corresponding to the stored charge of the capacitors Cf11, Cf12 obtained by an integrator 24a. Further, the quantization unit 13 quantizes the output voltage Vo1 of the block 414 and digitally outputs the quantized voltage to the control circuit 9, and the control circuit 9 selects the converted output VR to be used in the subsequent ΔΣ hold operation.

As thus described, the A/D conversion device 406 executes the A/D conversion processing by the ΔΣ method by repeatedly executing <ΔΣ sample operation in the hybrid mode> and <ΔΣ hold operation in the hybrid mode> a predetermined number of times to generate a high-order bit.

<Amplification Operation in Hybrid Mode>

The A/D conversion device 406 repeats <ΔΣ sample operation in hybrid mode> and <ΔΣ hold operation in hybrid mode> a predetermined number of times, and then amplifies the signal. At this time, although not shown, the control circuit 9 turns off the switch SS13 to disconnect the capacitors Csd1, Cs1 from the node Na, turns off the switch SF15, and turns on the switch SF18 to disconnect the output node Nb side of the capacitor Cf12, whereby the operational amplifier 24 and the capacitor Cf11 can amplify the signal in accordance with the charge stored in the capacitor Cf12 and output the amplified signal to the node Nb. This operation is the same as in the first embodiment described with reference to FIG. 9.

<Cyclic Operation in Hybrid Mode>

After the A/D conversion device 406 amplifies the signal, the A/D conversion processing is performed by the cyclic method. A block 414 performs the A/D conversion processing by the cyclic method, using the capacitor switching circuits 21, 22 and the capacitor Cf11 of the capacitor switching circuit 423b. The content of the control of each switch by the control circuit 9 is the same as the content of the control of <hybrid mode (cyclic operations Parts 1 to 3)> in the first embodiment described with reference to FIGS. 10 to 12, and a description thereof will be omitted.

The control circuit 9 performs predetermined digital integration processing with a digital integrator on the quantized value Qo generated by the A/D conversion processing by the ΔΣ method to generate a high-order bit, and sequentially adds the quantized value Qo obtained by the A/D conversion processing by the cyclic method to the generated high-order bit value, and the result of the addition is taken as the output data Do. In this way, a final A/D conversion result can be obtained.

(3) Cyclic Mode

In the cyclic mode as well, the block 414 performs the A/D conversion processing by the cyclic method, using the capacitor switching circuits 21, 22 and the capacitor Cf11 of the capacitor switching circuit 423b. The content of the control of each switch by the control circuit 9 is the same as that of "(3) Cyclic mode" in the first embodiment described with reference to FIGS. 13 to 15, and hence a description thereof will be omitted.

As shown in the present embodiment, even when the A/D conversion device 406 has a primary configuration with one stage of the blocks 414, the A/D conversion device 406 can be operated in each of the following modes: (1) ΔΣ mode, (2) cyclic mode, and (3) hybrid mode. As a result, while the same action effect as in the first embodiment can be obtained, the circuit can be simplified, the circuit scale can be reduced, and the power can also be reduced.

Fifth Embodiment

Figure 24:
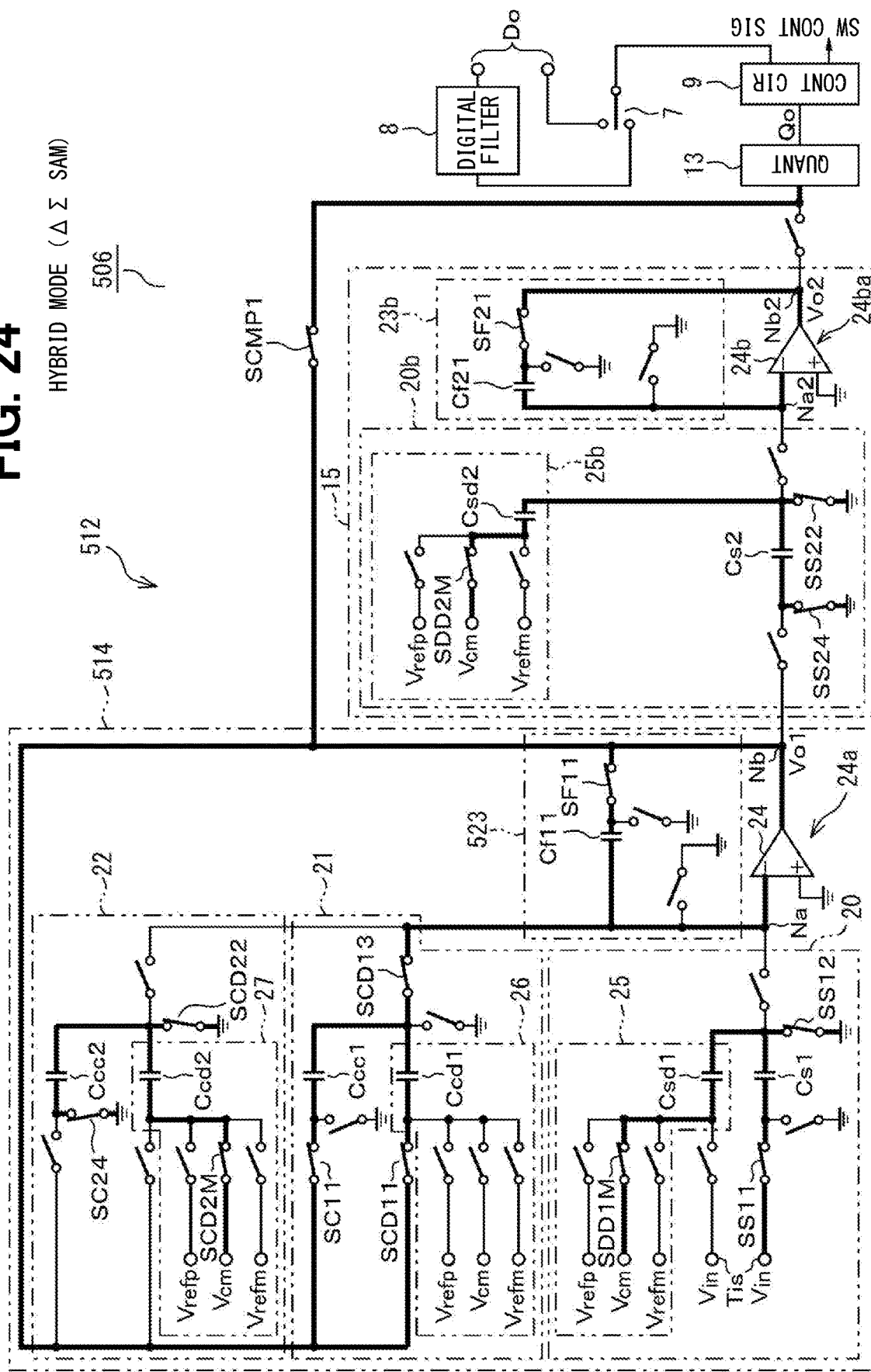
FIG. 24 is an electrical configuration diagram of an A/D conversion device showing a fifth embodiment, and an explanatory diagram schematically showing one operation stage in a hybrid mode (Part 1)
Figure 25:
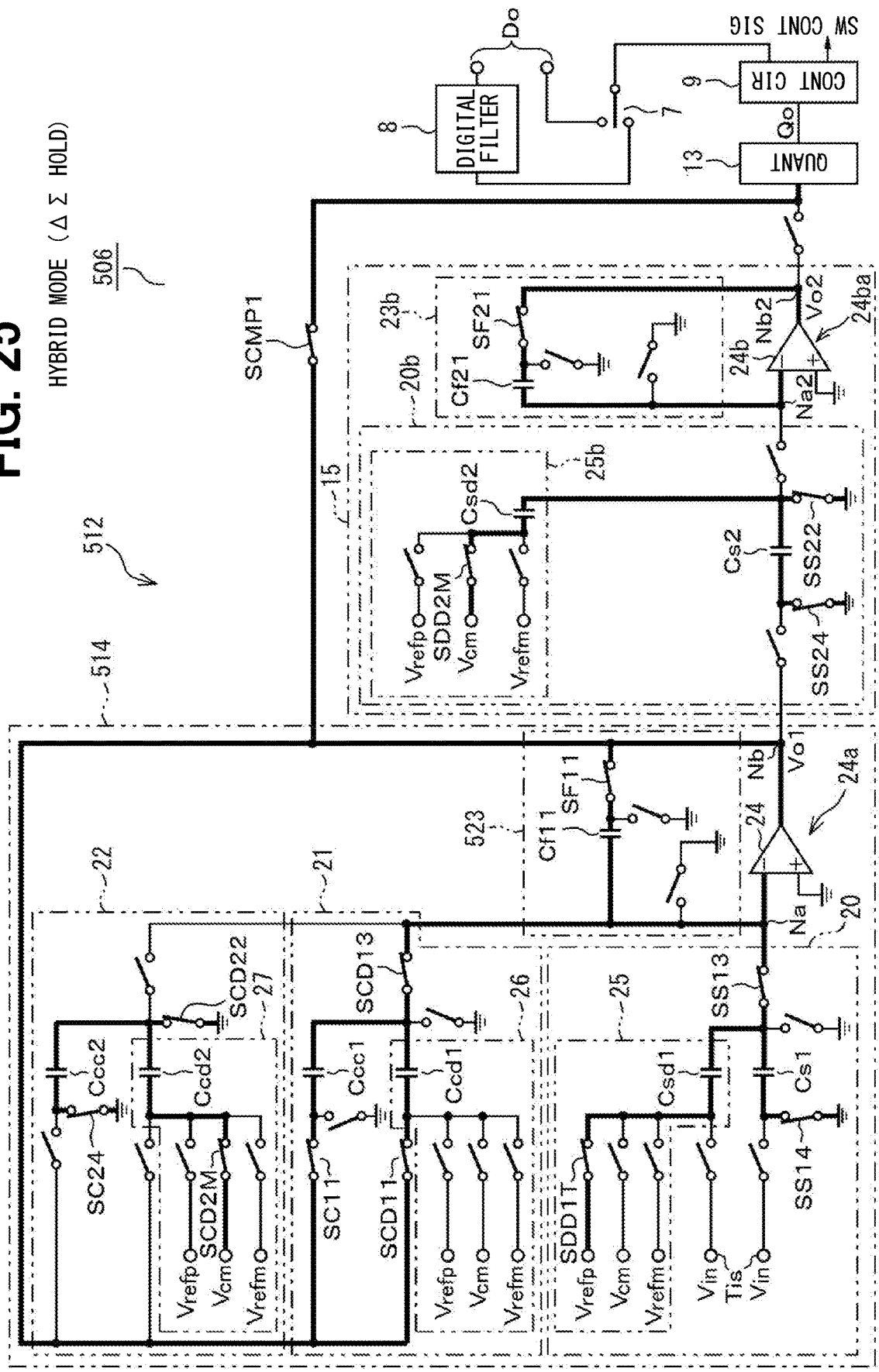
FIG. 25 is an explanatory diagram schematically showing one operation stage in the hybrid mode (Part 2)

The A/D conversion device 506 shown in FIGS. 24 and 25 includes a signal processing unit 512, a quantization unit 13, and the control circuit 9. The signal processing unit 512 of the present embodiment is made up of a first block 514 and a second block 15. The first block 514 will be described focusing on portions different from those of the first block 14 in the first embodiment.

A capacitor switching circuit 523 is connected between the input node Na and the output node Nb of the operational amplifier 24. The capacitor switching circuit 523 is provided in place of the capacitor switching circuit 23 of the first block 14, and has a configuration in which the capacitor Cf12 and the switches SF15 to SF18 for switching the charging/discharging of the capacitor Cf12 are omitted from the capacitor switching circuit 23. Thus, the circuit configuration area can be reduced by the configuration region for the capacitor Cf12 and the switches SF15 to SF18.

In actual use, the control circuit 9 may connect the capacitors Ccc1, Ccd1, Ccc2, Ccd2 of the capacitor switching circuits 21, 22 used in the cyclic method to the capacitor Cf11 (equivalent to the feedback capacitor) of the capacitor switching circuit 523 and use the capacitors.

For example, in <ΔΣ sample operation in hybrid mode> and <ΔΣ hold operation in hybrid mode> described in the first embodiment, the control circuit 9 turns on the switches SC11, SCD11, SCD13, SF11 to enable connection of the capacitors Cf11, Ccc1, Ccd1 between the input node Na and the output node Nb of the operational amplifier 24 as shown in FIGS. 24 and 25, whereby the capacitors Cf11, Ccc1, Ccd1 can all function as feedback capacitors.

Therefore, the capacitors Ccc1, Ccd1 used at the time of sampling the output voltage Vo1 of the first block 14 by the cyclic method can be used in common as the feedback capacitors, and can further be used in place of the capacitor Cf12 shown in the above-described embodiments.

Figure 26:
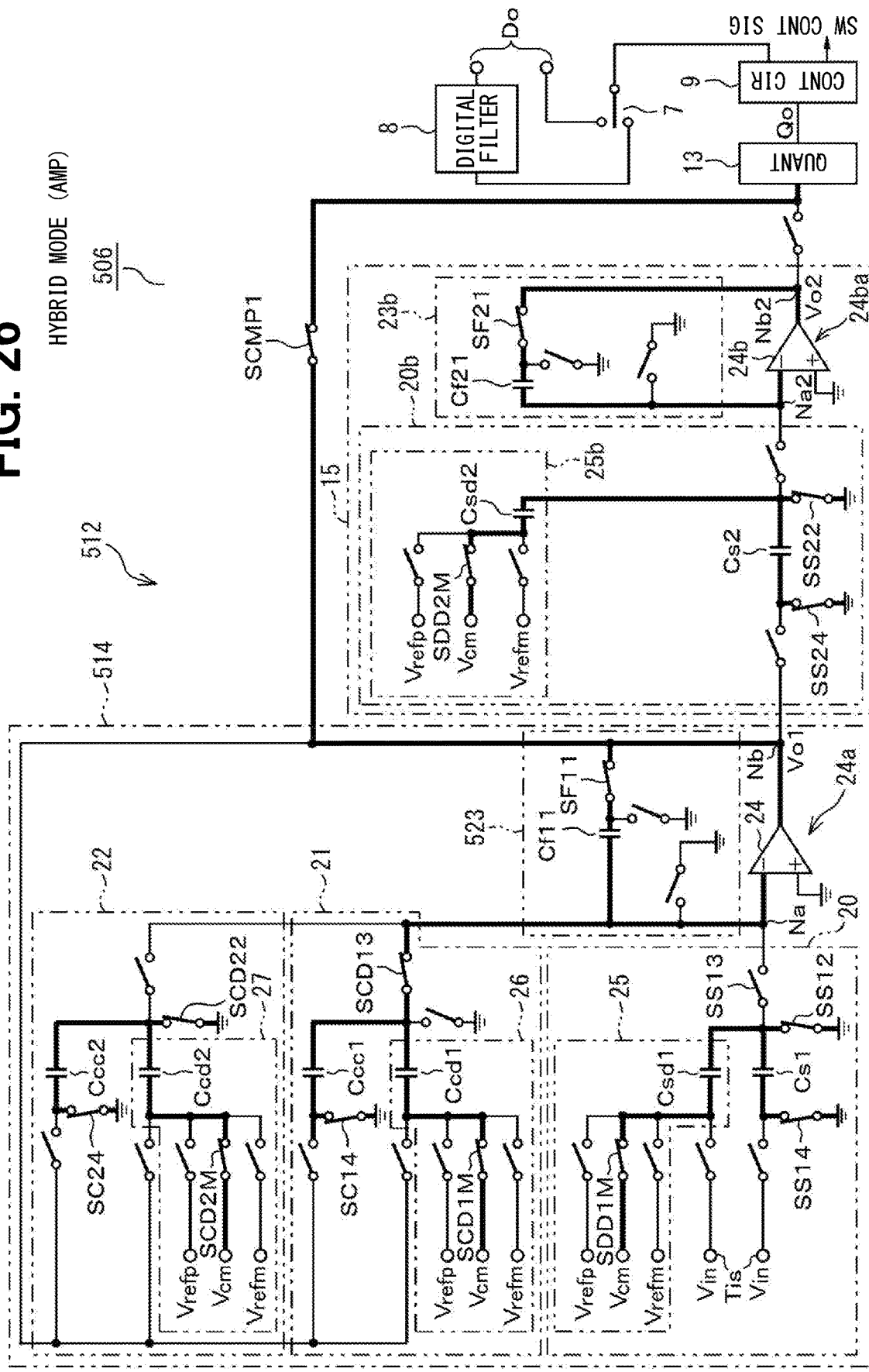
FIG. 26 is an explanatory diagram schematically showing one operation stage in the hybrid mode (Part 3)

In the A/D conversion device 506, at the time of amplification after repetition of the ΔΣ sample operation and the ΔΣ hold operation in the hybrid mode, the control circuit 9 turns on the switches SCD1M, SCD13, SF11, SC14 to enable signal amplification in accordance with the charge stored in the capacitors Ccc1, Ccd1, Cf11 as shown in FIG. 26. The cyclic sample operation and the cyclic hold operation in the latter half of the hybrid mode can be executed by the same control approach as in the above-described embodiments, and hence a detailed description thereof will be omitted.

Sixth Embodiment

Figure 27:
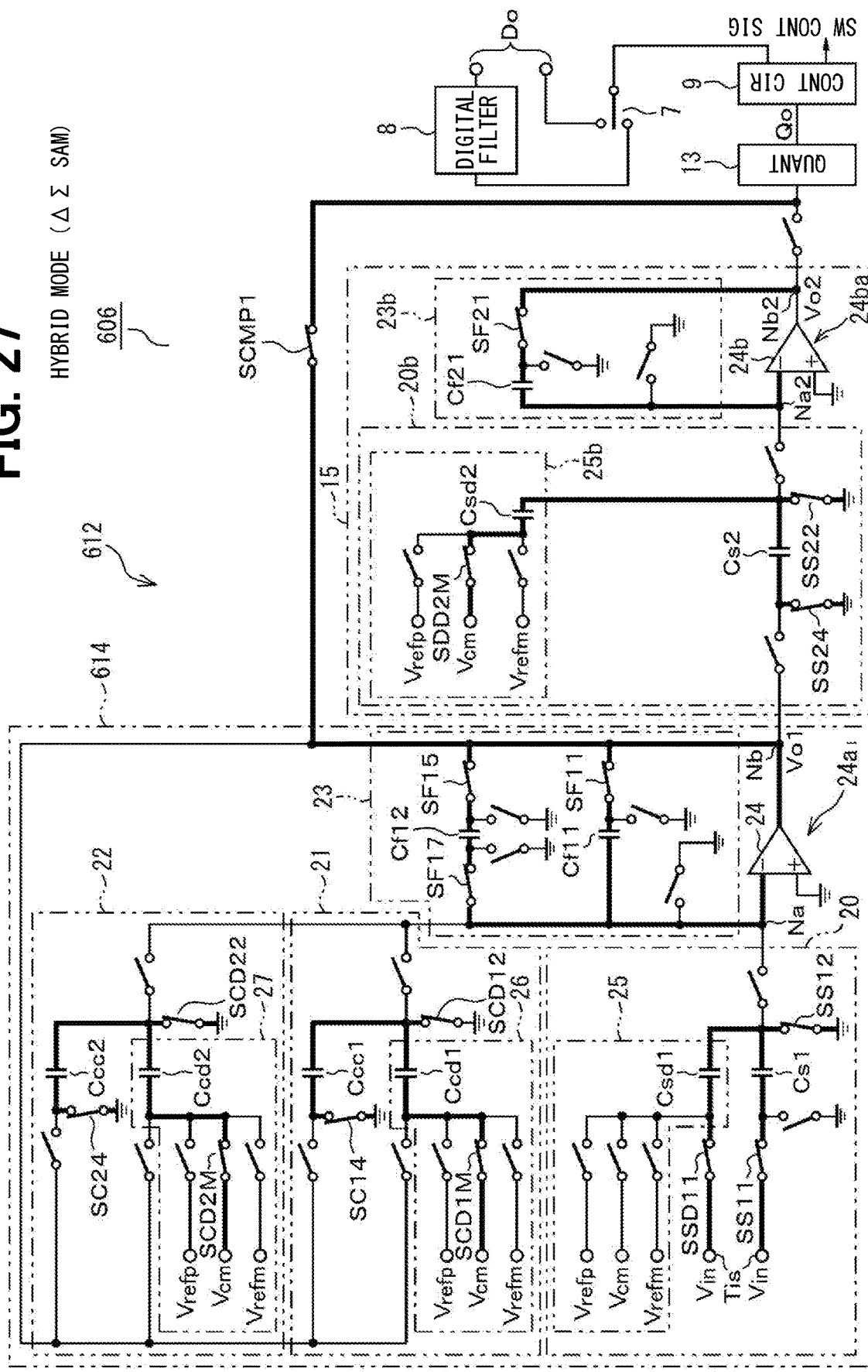
FIG. 27 is an electrical configuration diagram of an A/D conversion device showing a sixth embodiment, and an explanatory diagram schematically showing one operation stage in the hybrid mode (Part 1)
Figure 28:
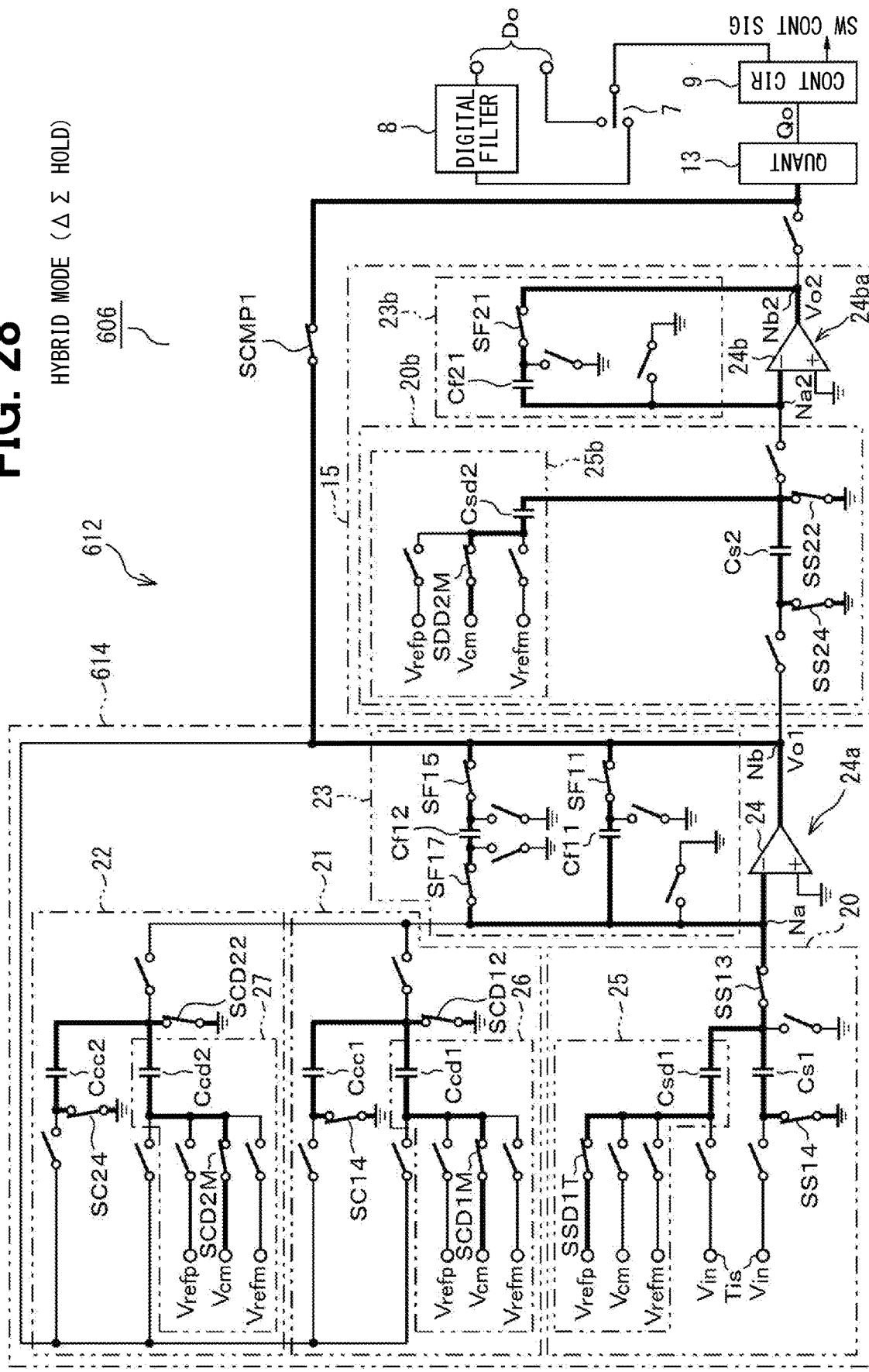
FIG. 28 is an explanatory diagram schematically showing one operation stage in the hybrid mode (Part 2).

As shown in FIGS. 27 and 28, the A/D conversion device 606 includes a signal processing unit 612, a quantization unit 13, and the control circuit 9. The signal processing unit 612 of the present embodiment is made up of a first block 514 and a second block 15. The sixth embodiment differs from the first embodiment in how to sample the analog input signal Vin.

In <ΔΣ sample operation in hybrid mode>, as shown in FIG. 27, the control circuit 9 turns on the switches SSD11, SS11, SS12 to enable connection of the capacitors Csd1, Cs1 in parallel and inputting of the analog input signal Vin. Thereafter, in <ΔΣ hold operation in hybrid mode>, as shown in FIG. 28, the control circuit 9 turns on the switches SS14, SS13 of the first block 14 and the switch (here, assumed to be SDD1T.) of the D/A converter 25 corresponding to the converted output VR to connect one ends of the capacitors Cs1, Csd1 to the inverting input terminal of the operational amplifier 24.

During the above-described ΔΣ sample operation, charge is stored into each of the capacitors Cs1, Csd1, but during the ΔΣ hold operation, as in the above-described embodiments, residual charge, obtained by subtracting the charge corresponding to the converted output VR from the stored charge of the capacitors Cs1, Csd1 and fed back, is transferred to the capacitors Cf11, Cf12. Thus, the first block 614 outputs from the node Nb the integrated voltage corresponding to the stored charge of the capacitors Cf11, Cf12 obtained by the integrator 24a.

Therefore, the capacitor Csd1 functions not only as a sampling capacitor in the hybrid mode but also as a DAC capacitor of the D/A converter 25 For example, a case is considered in which designing is made with the capacitance value of the sampling capacitor set to 1 pF and the capacitance value of the DAC capacitor set to 0.5 pF. When the sampling capacitor of the analog input signal Vin and the DAC capacitor of the D/A converter 25 are individually configured and designed not to be shared as in the first embodiment, a total of 1.5 pF is required by setting the capacitance value of the capacitor Cs1 to 1 pF and the capacitance value of the capacitor Csd1 to 0.5 pF However, as shown in the present embodiment, when the sampling capacitor and the DAC capacitor are partially shared, the capacitor can be achieved by setting the capacitance value of the capacitor Cs1 to 0.5 pF and the capacitance value of the capacitor Csd1 to 0.5 pF, so that the circuit can be configured with a smaller area.

According to the present embodiment, since the sampling capacitor and the DAC capacitor are at least partially shared, the sampling capacitor and the DAC capacitor can be configured with a smaller area.

OTHER EMBODIMENTS

The converted output VR of the quantization unit 13 is not limited to three levels but may be appropriately set in accordance with the number of levels of the quantized value Qo in the quantization unit 13. In accordance with this number of levels, the number of levels of the converted outputs VR of the D/A converters 25, 26, 27 in the capacitor switching circuits 20, 21, 22 may also be changed The capacitance values of the capacitors Cs1, Csd1, Cs2, Csd2, Ccc1, Ccc1, Ccc2, Ccd2, Cf11, Cf12, Cf21 may be appropriately scaled so as to correspond to the input/output ranges of each of the operational amplifiers 24, 24b.

Although the fourth embodiment has shown the form in which the quantization unit 13 is constituted using one A/D converter, the present disclosure is not limited thereto, but the quantization unit 213 for switching the two quantizers 213a, 213b for each mode may be used.

In the above-described embodiments, the signal processing unit 12 is constituted by a ΔΣ modulator using the blocks 14 and 15 and the quantization unit 13, but the type of the ΔΣ modulator is not limited to the above-described embodiment. For example, the signal processing unit 12 may be configured to operate as a second-order CIFF (Cascade of Integrators with FeedForward) ΔΣ modulator that is a typical example of a feedforward ΔΣ modulator.

In the above-described embodiments, as the first block 14, the second block 15, and the like, a single-ended circuit has been shown where a signal is input to the inverting input terminal which is the input of one of the operational amplifiers 24, 25a, and the non-inverting input terminal which is the other input is connected to the analog ground line. However, the circuit may be constituted by a differential type where a differential signal is input to a fully differential type or pseudo differential type operational amplifier.

Although the forms of the A/D conversion device 6, 306, 406, 506, 606 each having the three modes of the ΔΣ mode, the hybrid mode, and the cyclic mode have been described, the present disclosure is not limited thereto but can be applied to an A/D conversion device having any two of these modes.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An A/D conversion device that operates in at least two or more modes, which includes: a ΔΣ mode in which an analog input signal is processed by an A/D conversion process with a ΔΣ method; and a hybrid mode in which the analog input signal is processed by the A/D conversion process with the ΔΣ method and then a residual is processed by the A/D conversion process with a cyclic method, the A/D conversion device comprising:
   a first block that receives the analog input signal and processes the analog input signal by a first amplifier;
   a second block including a second amplifier that receives an output voltage of the first block;
   a quantization unit that receives one of outputs of the first block and the second block and quantizes the one of the outputs; and
   a control circuit that switches the at least two or more modes and controls a switching of a mode to perform a control corresponding to the mode, wherein:
   in the ΔΣ mode, the control circuit uses the first amplifier of the first block and the second amplifier of the second block to quantize the output of the second block by the quantization unit and to process the output by the A/D conversion process with the ΔΣ method; and
   in the hybrid mode, the control circuit uses the first amplifier of the first block without using the second amplifier of the second block to quantize the output of the first amplifier of the first block by the quantization unit with the ΔΣ method and to process the output by the A/D conversion process, and then the control circuit uses the first amplifier to process the residual by the A/D conversion process with the cyclic method.

2. The A/D conversion device according to claim 1, wherein:
   the first block includes a sampling capacitor for sampling the analog input signal; and
   the sampling capacitor is configured so that an input sampling capacitance is switchable between the ΔΣ mode and a mode other than the ΔΣ mode.

3. The A/D conversion device according to claim 1, wherein:
   the first amplifier of the first block includes an operational amplifier that connects a feedback capacitor between an input node and an output node of the operational amplifier when the first block outputs an integrated voltage; and
   the first amplifier of the first block shares another capacitor as the feedback capacitor when sampling the output of the first block with the cyclic method.

4. The A/D conversion device according to claim 1, further comprising:
a sampling capacitor for sampling the analog input signal; and
a D/A converter that performs D/A conversion using a D/A converter capacitor in accordance with a digital output of the quantization unit when the A/D conversion process is performed with the ΔΣ method, wherein:
at least a part of the sampling capacitor and at least a part of the D/A converter capacitor are common.

5. The A/D conversion device according to claim 1, wherein:
the quantization unit includes:
a first quantizer that quantizes the output of the second amplifier of the second block in the ΔΣ mode; and
a second quantizer that quantizes the output of the first amplifier of the first block in the mode other than the ΔΣ mode.

6. The A/D conversion device according to claim 1, further comprising:
a current cut unit that cuts a current of the second amplifier of the second block in the mode other than the ΔΣ mode.

7. The A/D conversion device according to claim 6 wherein:
in the mode other than ΔΣ mode, a common mode feedback circuit of the second amplifier of the second block is operated, and another circuit is not operated.

8. An A/D conversion device that operates in at least two or more modes, which includes: a ΔΣ mode in which an analog input signal is processed by an A/D conversion process with a ΔΣ method; and a cyclic mode in which the analog input signal is processed by the A/D conversion process with a cyclic method, the A/D conversion device comprising:
a first block that receives the analog input signal and processes the analog input signal by a first amplifier;
a second block including a second amplifier that receives an output voltage of the first block;
a quantization unit that receives one of outputs of the first block and the second block and quantizes the one of the outputs; and
a control circuit that switches the at least two or more modes and controls a switching of a mode to perform a control corresponding to the mode, wherein:
in the ΔΣ mode, the control circuit uses the first amplifier of the first block and the second amplifier of the second block to quantize the output of the second block by the quantization unit and to process the output by the A/D conversion process with the ΔΣ method; and
in the cyclic mode, the control circuit uses the first amplifier of the first block without using the second amplifier of the second block to quantize the output of the first amplifier of the first block by the quantization unit and to process the output by the A/D conversion process with the cyclic method.

9. The A/D conversion device according to claim 8, wherein:
the first block includes a sampling capacitor for sampling the analog input signal; and
the sampling capacitor is configured so that an input sampling capacitance is switchable between the ΔΣ mode and a mode other than the ΔΣ mode.

10. The A/D conversion device according to claim 8, wherein:
the first amplifier of the first block includes an operational amplifier that connects a feedback capacitor between an input node and an output node of the operational amplifier when the first block outputs an integrated voltage; and
the first amplifier of the first block shares another capacitor as the feedback capacitor when sampling the output of the first block with the cyclic method.

11. The A/D conversion device according to claim 8, further comprising:
a sampling capacitor for sampling the analog input signal; and
a D/A converter that performs D/A conversion using a D/A converter capacitor in accordance with a digital output of the quantization unit when the A/D conversion process is performed with the ΔΣ method, wherein:
at least a part of the sampling capacitor and at least a part of the D/A converter capacitor are common.

12. The A/D conversion device according to claim 8, wherein:
the quantization unit includes:
a first quantizer that quantizes the output of the second amplifier of the second block in the ΔΣ mode; and
a second quantizer that quantizes the output of the first amplifier of the first block in the mode other than the ΔΣ mode.

13. The A/D conversion device according to claim 8, further comprising:
a current cut unit that cuts a current of the second amplifier of the second block in the mode other than the ΔΣ mode.

14. The A/D conversion device according to claim 13 wherein:
in the mode other than ΔΣ mode, a common mode feedback circuit of the second amplifier of the second block is operated, and another circuit is not operated.

15. An A/D conversion device that operates in at least three or more modes, which includes: a ΔΣ mode in which an analog input signal is processed by an A/D conversion process with a ΔΣ method; a cyclic mode in which the analog input signal is processed by the A/D conversion process with a cyclic method; and a hybrid mode in which the analog input signal is processed by the A/D conversion process with the ΔΣ method and then a residual is processed by the A/D conversion process with a cyclic method, the A/D conversion device comprising:
a first block that receives the analog input signal and processes the analog input signal by a first amplifier;
a second block including a second amplifier that receives an output voltage of the first block;
a quantization unit that receives one of outputs of the first block and the second block and quantizes the one of the outputs; and
a control circuit that switches the at least three or more modes and controls a switching of a mode to perform a control corresponding to the mode, wherein:
in the ΔΣ mode, the control circuit uses the first amplifier of the first block and the second amplifier of the second block to quantize the output of the second block by the quantization unit and to process the output by the A/D conversion process with the ΔΣ method;
in the hybrid mode, the control circuit uses the first amplifier of the first block without using the second amplifier of the second block to quantize the output of the first amplifier of the first block by the quantization unit with the ΔΣ method and to process the output by the A/D conversion process, and then the control circuit uses the first amplifier to process the residual by the A/D conversion process with the cyclic method; and in the cyclic mode, the control circuit uses the first amplifier of the first block without using the second amplifier of the second block to quantize the output of the first amplifier of the first block by the quantization unit and to process the output by the A/D conversion process with the cyclic method.

16. The A/D conversion device according to claim 15 wherein:
the first block includes a sampling capacitor for sampling the analog input signal; and
the sampling capacitor is configured so that an input sampling capacitance is switchable between the ΔΣ mode and a mode other than the ΔΣ mode.

17. The A/D conversion device according to claim 15, wherein:
the first amplifier of the first block includes an operational amplifier that connects a feedback capacitor between an input node and an output node of the operational amplifier when the first block outputs an integrated voltage; and
the first amplifier of the first block shares another capacitor as the feedback capacitor when sampling the output of the first block with the cyclic method.

18. The A/D conversion device according to claim 15, further comprising:
a sampling capacitor for sampling the analog input signal; and
a D/A converter that performs D/A conversion using a D/A converter capacitor in accordance with a digital output of the quantization unit when the A/D conversion process is performed with the ΔΣ method, wherein:
at least a part of the sampling capacitor and at least a part of the D/A converter capacitor are common.

19. The A/D conversion device according to claim 15, wherein:
the quantization unit includes:
a first quantizer that quantizes the output of the second amplifier of the second block in the ΔΣ mode; and
a second quantizer that quantizes the output of the first amplifier of the first block in the mode other than the ΔΣ mode.

20. The A/D conversion device according to claim 15, further comprising:
a current cut unit that cuts a current of the second amplifier of the second block in the mode other than the ΔΣ mode.

21. The A/D conversion device according to claim 20 wherein:
in the mode other than ΔΣ mode, a common mode feedback circuit of the second amplifier of the second block is operated, and another circuit is not operated.

22. An A/D conversion device that operates in at least two or more modes, which includes: a ΔΣ mode in which an analog input signal is processed by an A/D conversion process with a ΔΣ method; and a hybrid mode in which the analog input signal is processed by the A/D conversion process with the ΔΣ method and then a residual is processed by the A/D conversion process with a cyclic method, the A/D conversion device comprising:
a block that receives the analog input signal and processes the analog input signal by an amplifier;
a quantization unit that quantizes an output of the block;
a control circuit that switches the at least two or more modes and controls a switching of a mode to perform a control corresponding to the mode;
a first sampling capacitor for sampling the analog input signal;
a first capacitor for sampling the analog input signal;
a second sampling capacitor for sampling an output voltage of the block;
a first capacitor switching circuit (20) that charges and discharges the first capacitor constituting a first D/A converter; and
a second capacitor switching circuit that charges and discharges a second capacitor constituting a second D/A converter, wherein:
in the ΔΣ mode, the control circuit
performs a first ΔΣ operation of sampling the analog input signal in the first capacitor using the amplifier of the block,
performs a second ΔΣ operation of charging or discharging the first capacitor of the first D/A converter in accordance with a digital output of the quantization unit, inputting an output voltage integrated by the amplifier into the quantization unit, and sampling the output voltage using the second sampling capacitor,
performs a third ΔΣ operation of charging or discharging the second capacitor of the second D/A converter and the second sampling capacitor in accordance with the digital output of the quantization unit and inputting the output voltage integrated by the amplifier into the quantization unit, and
repeating the second ΔΣ operation and the third ΔΣ operation to quantize using the quantization unit and to process by the A/D conversion process an output voltage integrated by the amplifier of the block with the ΔΣ method; and
in the hybrid mode, the control circuit
performs a fourth ΔΣ operation of sampling the analog input signal in the first sampling capacitor using the amplifier of the block,
performs a fifth ΔΣ operation of charging or discharging the first capacitor of the first D/A converter and the first sampling capacitor in accordance with the digital output of the quantization unit, and inputting the output voltage integrated by the amplifier into the quantization unit, and
repeating the fourth ΔΣ operation and the fifth ΔΣ operation to process the output voltage of the amplifier of the block by the A/D conversion process with the ΔΣ method and to process the residual by the A/D conversion process with the cyclic method.

23. An A/D conversion device that operates in at least two or more modes, which includes: a ΔΣ mode in which an analog input signal is processed by an A/D conversion process with a ΔΣ method; and a cyclic mode in which the analog input signal is processed by the A/D conversion process with a cyclic method, the A/D conversion device comprising:
a block that receives the analog input signal and processes the analog input signal by an amplifier;
a quantization unit that quantizes an output of the block;
a control circuit that switches the at least two or more modes and controls a switching of a mode to perform a control corresponding to the mode;
a first sampling capacitor for sampling the analog input signal;

a first capacitor for sampling the analog input signal;

a second sampling capacitor for sampling an output voltage of the block;

a first capacitor switching circuit that charges and discharges the first capacitor constituting a first D/A converter; and a second capacitor switching circuit that charges and discharges a second capacitor constituting a second D/A converter, wherein:

in the ΔΣ mode, the control circuit performs a first ΔΣ operation of sampling the analog input signal in the first capacitor using the amplifier of the block, performs a second ΔΣ operation of charging or discharging the first capacitor of the first D/A converter in accordance with a digital output of the quantization unit, inputting an output voltage integrated by the amplifier into the quantization unit, and sampling the output voltage using the second sampling capacitor, performs a third ΔΣ operation of charging or discharging the second capacitor of the second D/A converter and the second sampling capacitor in accordance with the digital output of the quantization unit and inputting the output voltage integrated by the amplifier into the quantization unit, and repeating the second ΔΣ operation and the third ΔΣ operation to quantize using the quantization unit and to process by the A/D conversion process an output voltage integrated by the amplifier of the block with the ΔΣ method; and in the cyclic mode, the control circuit quantizes using the quantization unit and process by the A/D conversion process with the cyclic method an output voltage integrated by the amplifier of the block.

* * * * *